United States Patent [19]

Bowles et al.

[11] Patent Number: 5,163,161
[45] Date of Patent: Nov. 10, 1992

[54] FAST SCANNING RADIO RECEIVER WITH FREQUENCY DATA BASE MANAGEMENT BY REMOTE PROCESSOR

[75] Inventors: Byron D. Bowles; Lowell G. Atkinson, both of Indianapolis, Ind.

[73] Assignee: Crum Development Corp., Indianapolis, Ind.

[21] Appl. No.: 432,957

[22] Filed: Nov. 7, 1989

[51] Int. Cl.$^5$ ............................................... H03J 7/18
[52] U.S. Cl. ............................ 455/164.1; 455/165.1; 455/166.1; 455/186.1
[58] Field of Search .............. 455/165, 161, 166, 164, 455/168, 183, 185, 186, 253-258, 260

[56] References Cited

U.S. PATENT DOCUMENTS

| | | | |
|---|---|---|---|
| 4,521,915 | 6/1985 | Baker et al. | 455/165 |
| 4,556,989 | 12/1985 | Matsuoka et al. | 455/183 |
| 4,901,036 | 2/1990 | Herold et al. | 331/25 |
| 4,926,497 | 5/1990 | Shirley, Jr. et al. | 455/67 |
| 5,014,348 | 5/1991 | Boone et al. | 455/165 |

OTHER PUBLICATIONS

AOR, Ltd., *AR2002 Professional Monitor Receiver Sales Brochure, AR2002 Schematic Diagram, and RC PACK Schematic Diagram*, 1987.
Ryan, T., "New Fairchild Receiver Contains Microprocessor," *Electronic Warfare*, Sep./Oct. 1974, vol. 6, No. 5, 5 pages.
FSR-1000 Receiver Brochure, Fairchild Space and Defense Systems, 4 pages, Nov. 1991.
Ernandes, Frank, "FAIRS—Frequency Management," *Signal*, May/Jun. 1975, 8 pages.
Fairchild Surveillance Receiver Model FSR-1000 Operation and Maintenance Manual, Fairchild Space and Defense Systems, Feb. 1976, Table of Contents (pp. i-ii) and Section 3-64 (pp. 3-81-3-82).

*Primary Examiner*—Reinhard J. Eisenzopf
*Assistant Examiner*—Chi H. Pham
*Attorney, Agent, or Firm*—Welsh & Katz, Ltd.

[57] ABSTRACT

A scanning receiver includes an Electrically Erasable Programmable Read Only Memory (EEPROM) as massive nonvolatile storage for frequency control words. The receiver includes a microprocessor based receiver controller which executes data base management routines to manipulate the data base which is partitioned into scan banks of multiple frequency selection words and search banks of two limit frequency selection words. The software includes routines which can add or delete frequencies, change banks, control the scanning order of the banks, provide priority to a selected bank, and other functions. The EEPROM, to maintain its longevity, is only written to if bank of frequencies is changed while in the RAM of the receiver controller. After a bank of frequencies is changed in RAM, it is sorted in descending order so that a rapid slewing of the local oscillator frequency can be implemented in a single direction. The receiver controller further includes a communication routine and interface circuitry which allows the receiver to communicate with a remote processor, preferably a personal computer system. The remote processor executes an application program which allows the manipulation of a data base which emulates that of the scanning receiver stored in the EEPROM. Application routines allow the direct control of the receiver from the remote processor and the manipulation of the EEPROM data base including downloading or uploading bank data. The remote processor further controls an auto-frequency mode where frequencies which are found during the search mode of the receiver are uploaded to a file of the remote processor and stored for further examination.

29 Claims, 30 Drawing Sheets

REMOTE MENU

1. BANK MANAGEMENT
2. SCANNER CONTROL
3. CONVERSION UTILITY
4. ADD FILE TO DATA BASE

QUIT

| BANK 01 | BANK 21 | BANK 41 | BANK 61 |
| BANK 02 | BANK 22 | BANK 42 | BANK 62 |
| BANK 03 | BANK 23 | BANK 43 | BANK 63 |
| BANK 04 | BANK 24 | BANK 44 | BANK 64 |
| BANK 05 | BANK 25 | BANK 45 | BANK 65 |
| BANK 06 | BANK 26 | BANK 46 | BANK 66 |
| BANK 07 | BANK 27 | BANK 47 | BANK 67 |
| BANK 08 | BANK 28 | BANK 48 | BANK 68 |
| BANK 09 | BANK 29 | BANK 49 | BANK 69 |
| BANK 10 | BANK 30 | BANK 50 | BANK 70 |
| BANK 11 | BANK 31 | BANK 51 | BANK 71 |
| BANK 12 | BANK 32 | BANK 52 | BANK 72 |
| BANK 13 | BANK 33 | BANK 53 | BANK 73 |
| BANK 14 | BANK 34 | BANK 54 | BANK 74 |
| BANK 15 | BANK 35 | BANK 55 | BANK 75 |
| BANK 16 | BANK 36 | BANK 56 | BANK 76 |
| BANK 17 | BANK 37 | BANK 57 | BANK 77 |
| BANK 18 | BANK 38 | BANK 58 | BANK 78 |
| BANK 19 | BANK 39 | BANK 59 | FREQUEN |
| BANK 20 | BANK 40 | BANK 60 | |

PG UP PG DN HOME END ESC

FIG 3B

EDITING BANK01

| FREQ. | DESCRIPTION | FREQ. | DESCRIPTION |
| --- | --- | --- | --- |
| 162.5500 | N 5 | 0.0000 | 0 |
| 162.4750 | N 5 | 0.0000 | 0 |
| 162.4000 | N 5 | 0.0000 | 0 |
| 0.0000 | 0 | 0.0000 | 0 |
| 0.0000 | 0 | 0.0000 | 0 |
| 0.0000 | 0 | 0.0000 | 0 |
| 0.0000 | 0 | 0.0000 | 0 |
| 0.0000 | 0 | 0.0000 | 0 |
| 0.0000 | 0 | 0.0000 | 0 |
| 0.0000 | 0 | 0.0000 | 0 |
| 0.0000 | 0 | 0.0000 | 0 |
| 0.0000 | 0 | 0.0000 | 0 |
| 0.0000 | 0 | 0.0000 | 0 |
| 0.0000 | 0 | 0.0000 | 0 |
| 0.0000 | 0 | 0.0000 | 0 |
| 0.0000 | 0 | 0.0000 | 0 |

C/R F5-PRINT BANK F10-LOOK UP PG DN ESC

FIG 3C

```
EDITING BANK02

FREQ.      DESCRIPTION          FREQ.      DESCRIPTION
34.0400    N  5                 33.7200    N  5
34.0200    N  5
34.0000    N  5
33.9800    N  5
33.9600    N  5        FREQ.      BAND     STEP
33.9400    N  5        5.8850     N        5
33.9200    N  5        5.9750     N        5
33.9000    N  5        5.9900     N        5
33.8800    N  5        6.0400     N        5
33.8600    N  5        6.0600     N        5
33.8400    N  5        6.0650     N        5
33.8200    N  5        6.0850     N        5
33.8000    N  5        6.1450     N        5
33.7800    N  5        6.1750     N        5
33.7600    N  5        6.1950     N        5
33.7400    N  5

33.4200 N 5

C/R F5-PRINT BANK F10-LOOK UP PG DN ESC
```

FIG 3D

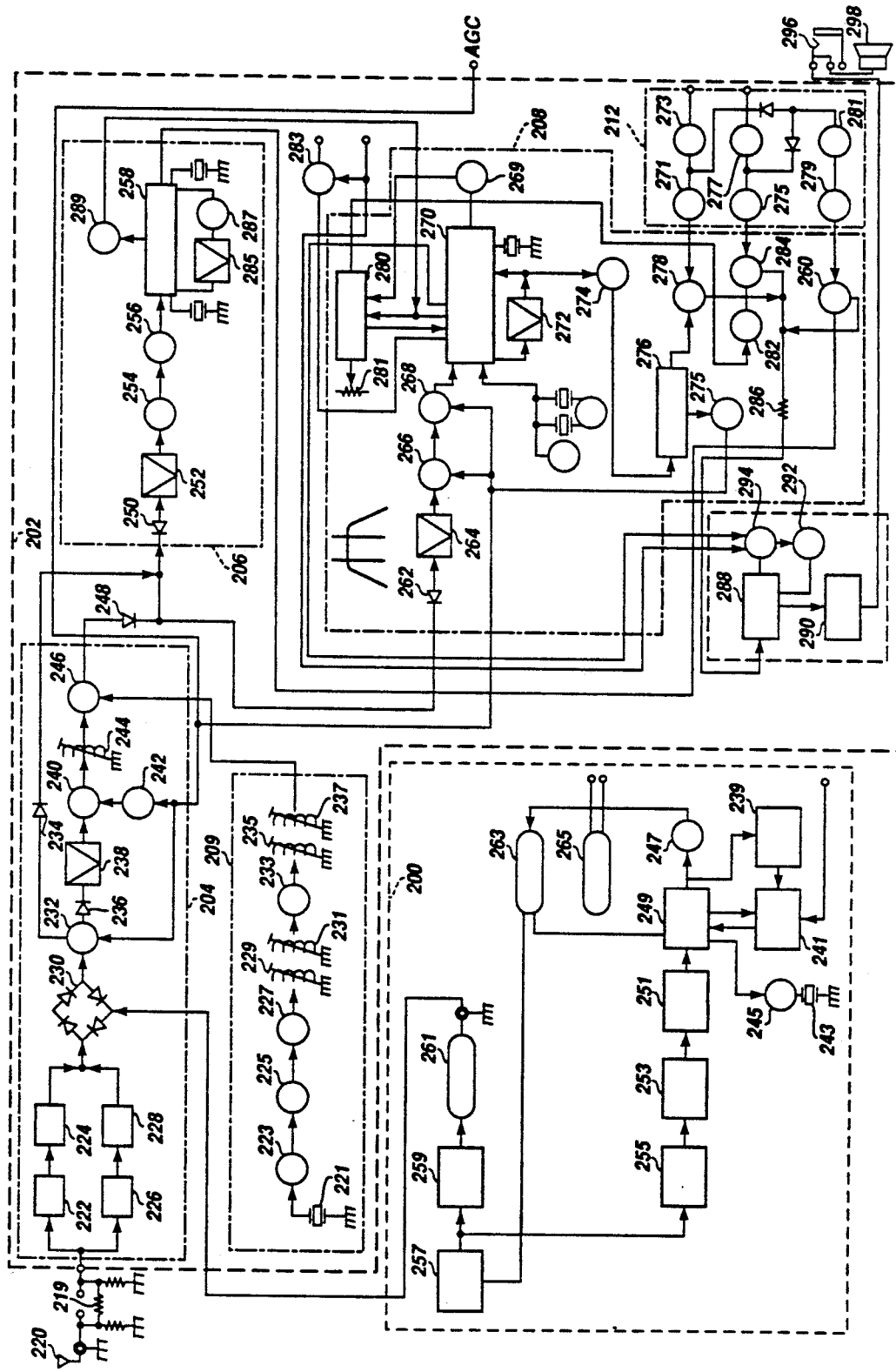

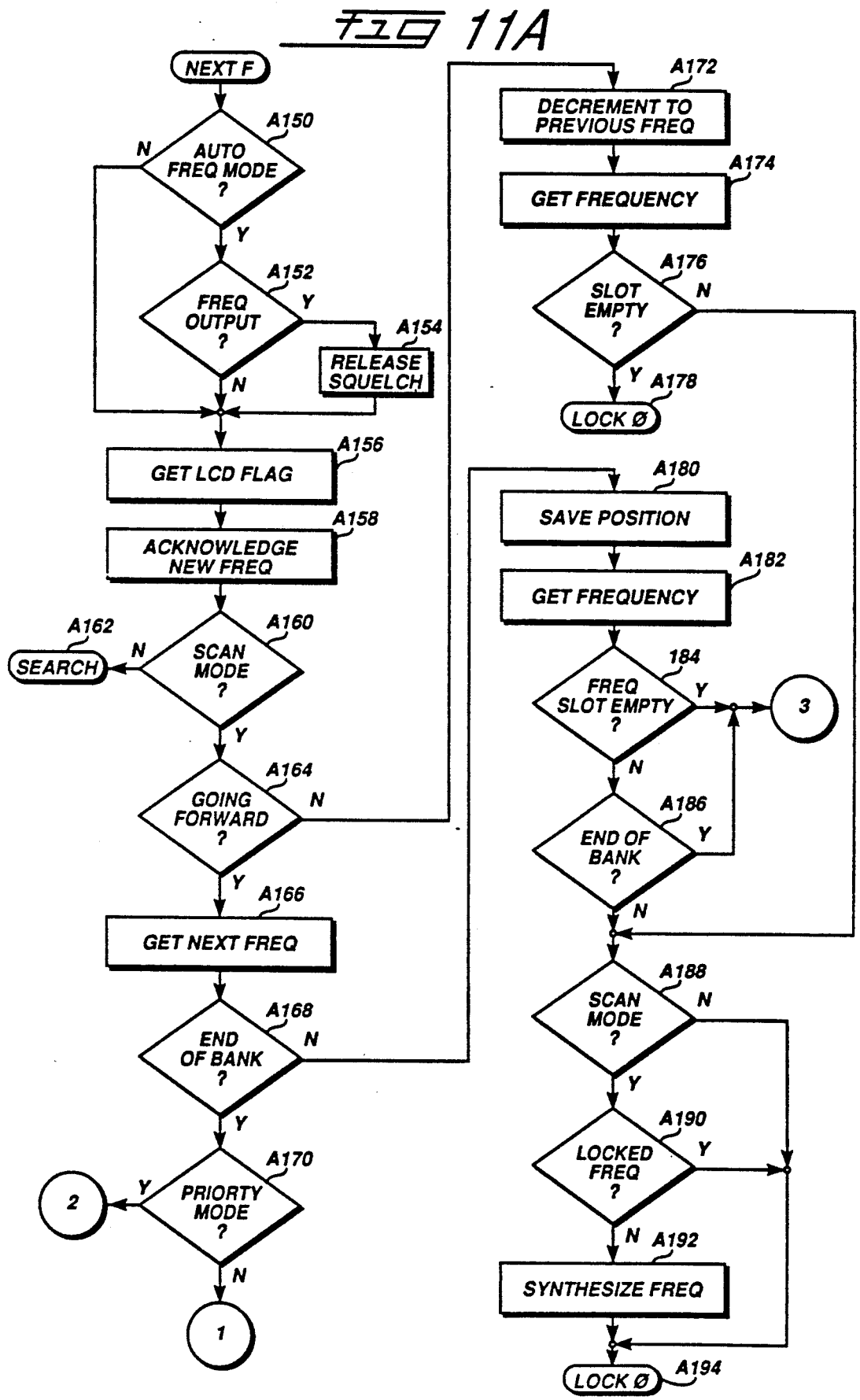

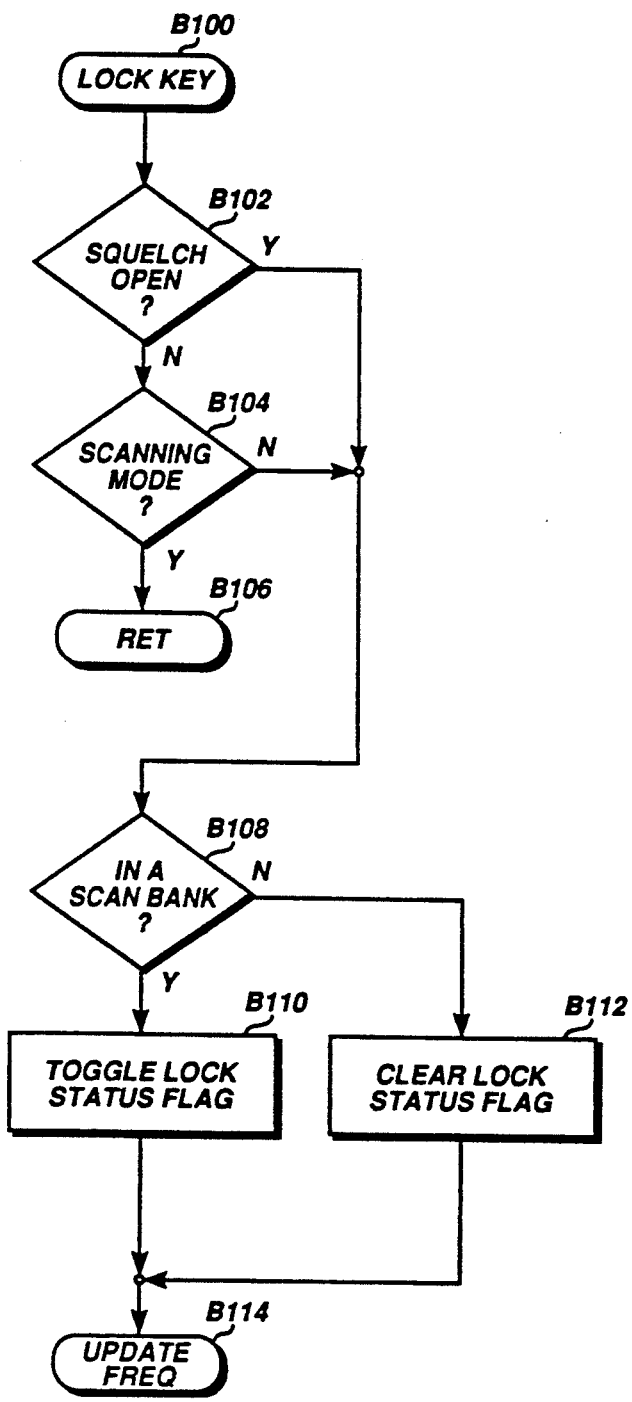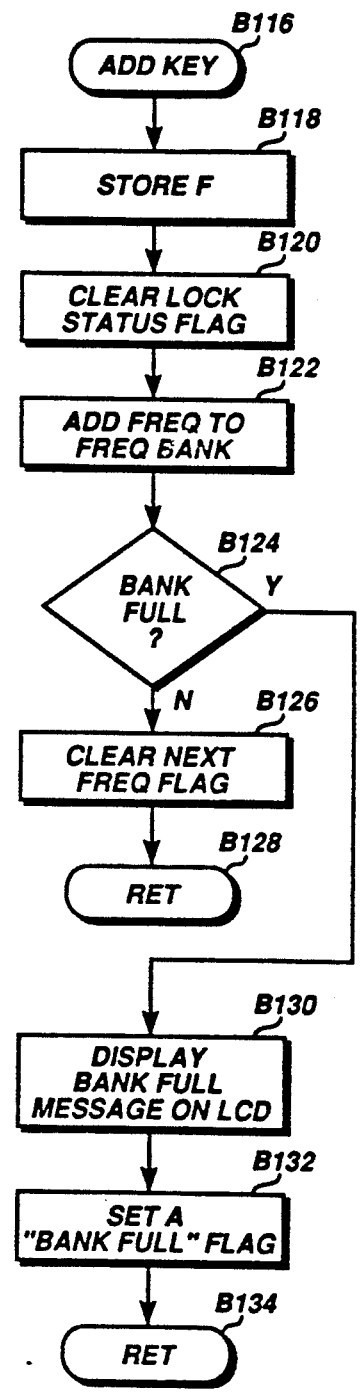
FIG 16I
FIG 16J

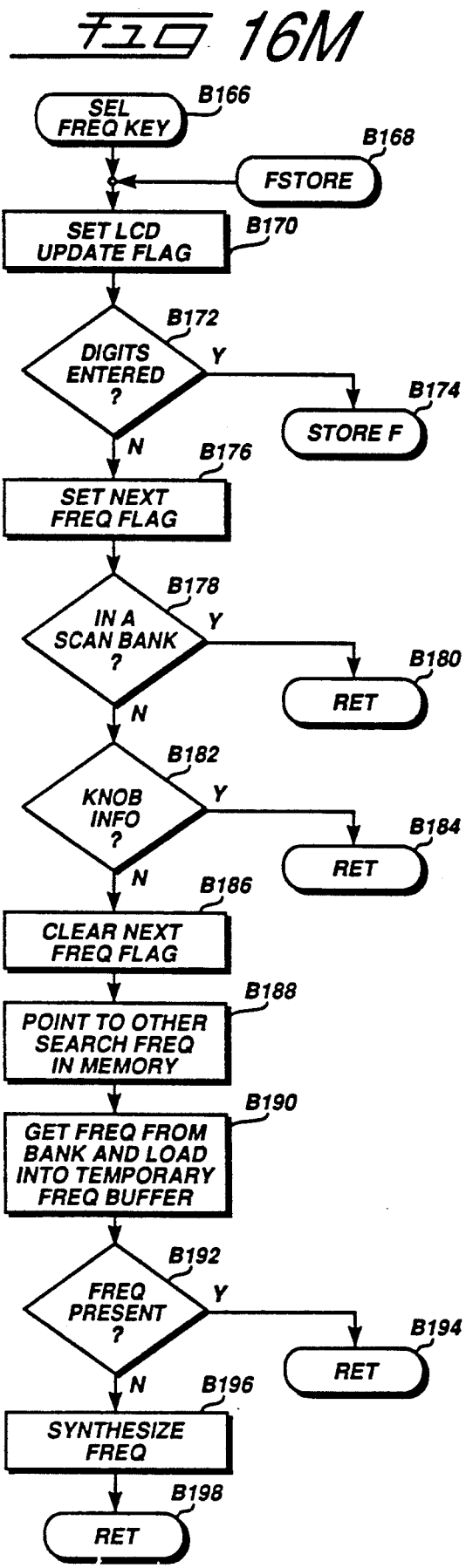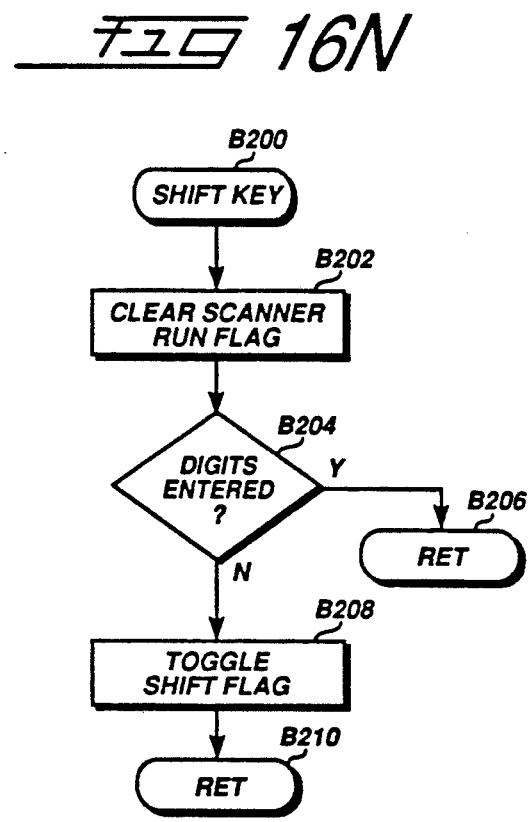

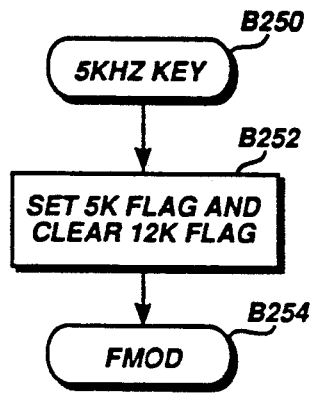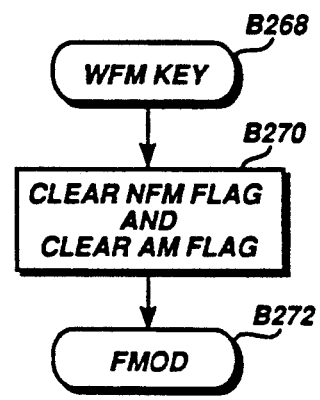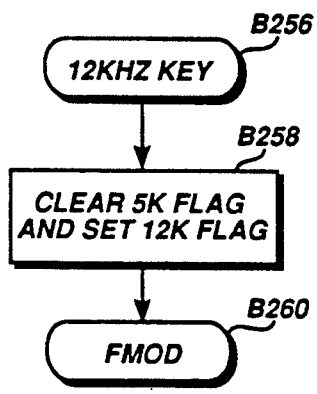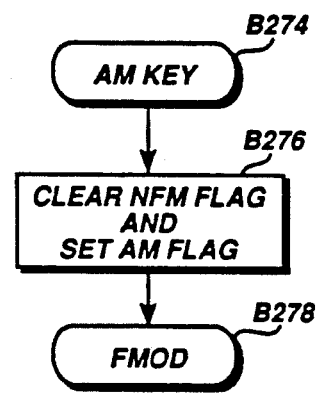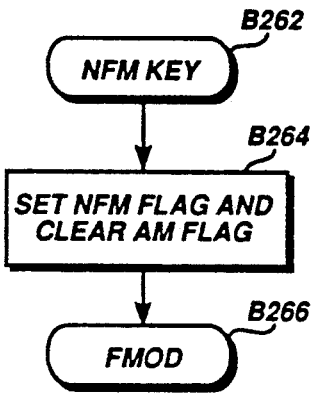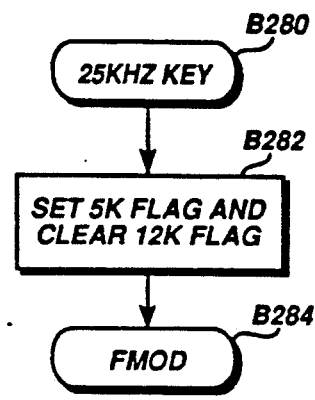

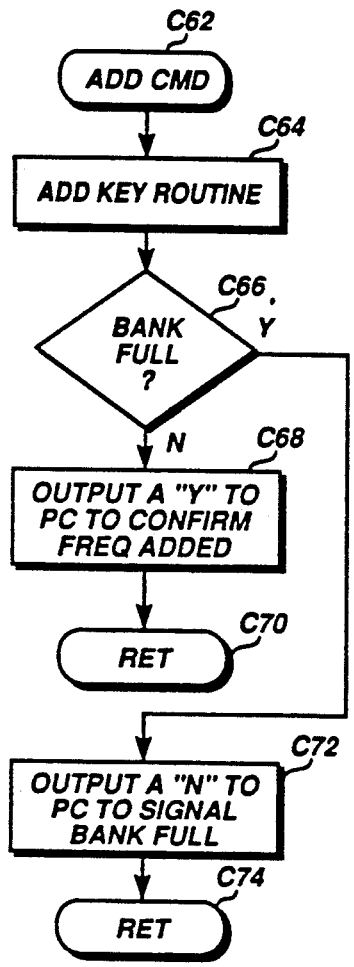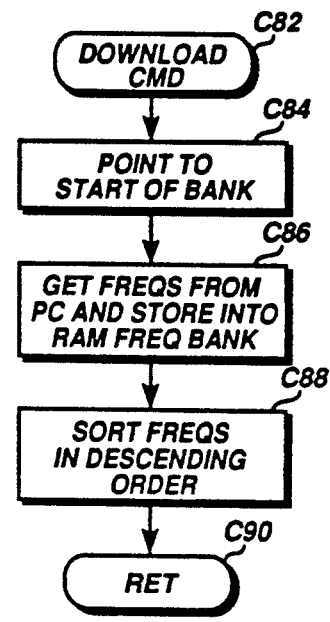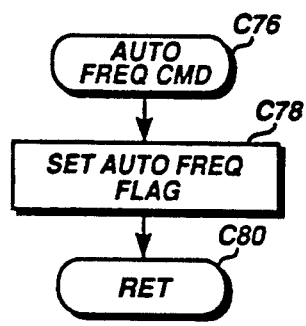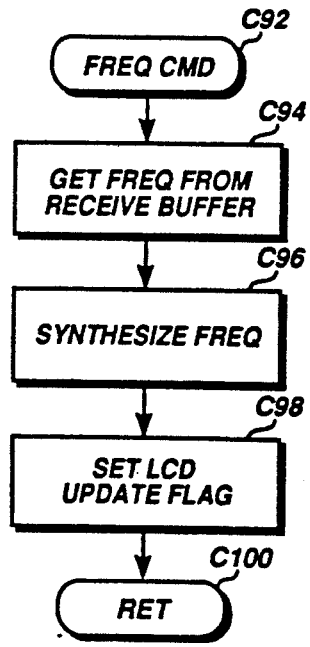

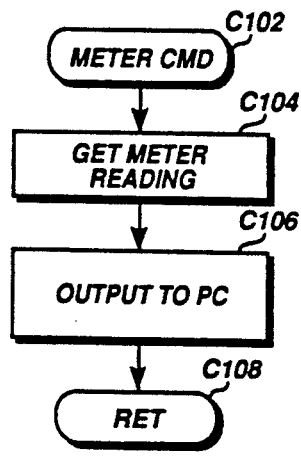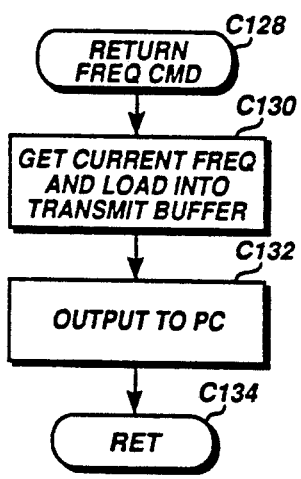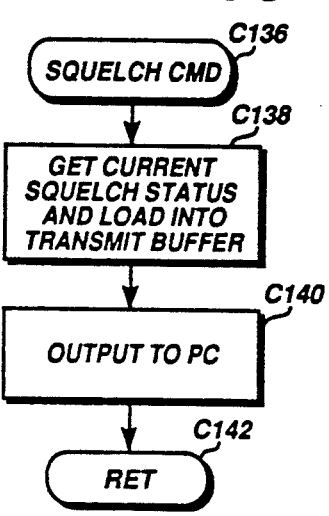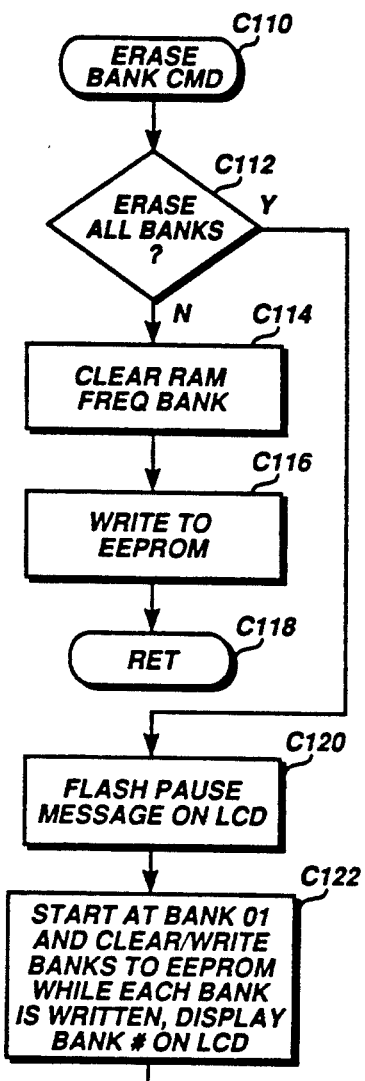

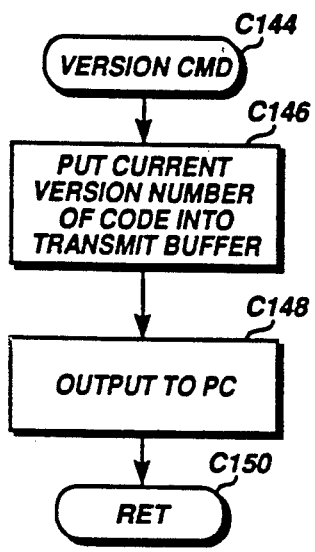
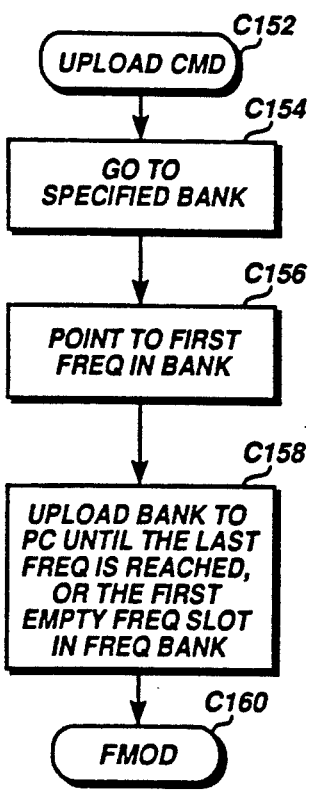
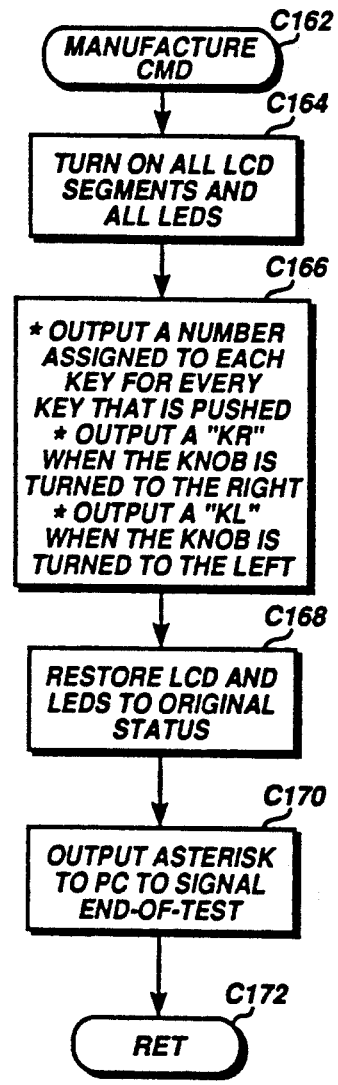

FAST SCANNING RADIO RECEIVER WITH FREQUENCY DATA BASE MANAGEMENT BY REMOTE PROCESSOR

BACKGROUND OF THE INVENTION

The invention pertains generally to scanning r for radio frequencies, and is more particularly directed to such receivers with the capability of communications with, and data base manipulation by, a remote processor.

A scanning receiver is generally known as a receiver which is adapted to receive information over a number of radio frequencies (RF) and bands. When placed in a scan mode, the receiver automatically steps between signals of different selected frequencies pausing at a signal long enough to allow the operator to determine if the channel information is of interest or not.

Early scanning receivers used crystals for tuning to the scanning frequencies, and the number of channels available for reception was limited by the number of crystals in a given receiver. A receiver typically contained either eight or sixteen crystals, and different crystals had to be installed to enable the reception of different frequencies. Particularly, whole sets of crystals had to be changed when it was desired to receive different bands, even when the same bands were desired but were assigned different frequencies in different geographical regions.

Many modern scanning receivers can generate the needed local oscillator frequencies across many bands. The local oscillator provides these frequencies with a digital frequency synthesizer which is controlled by digital frequency codes from a memory. Typically, the memory contains a small number of frequency codes which can be reprogrammed for operation on different frequencies. This limits channel capacity for the receiver, and, because of the need for frequent reprogramming, is only marginally better than switching crystal sets.

The channel capacity of scanning receivers has been limited not only because of the size, cost, and complexity of memory circuitry and associated addressing circuitry, but also because of technical limitations on scanning speed. A finite amount of time is required to lock on to each frequency in the actual scanning sequence, and then to detect activity on the current channel in order to determine whether or not to continue scanning. Large memories suggest widely separated frequencies which would slow scanning speeds to unacceptable levels.

Moreover, when a multiplicity of frequencies for a single band and a large number of bands are available for a scanning receiver, an operator can very easily lose track of which bands and frequencies are available for reception. Programming and changing bands becomes difficult to manage, and the reasons for storing particular channels in a band may be forgotten. Therefore, without sophisticated data management techniques, the capability of a large memory scanning receiver could not be used to its greatest advantage.

One significant disadvantage of scanning receivers with large memories is that receivers with memories usually scan the frequencies in the order in which they are input by the operator. This exacerbates the problem of increasing the scanning time where the frequencies may be separated by many MHz, reside in different bands, and even vary by type of detection. Even assuming the best case scenario, where the input frequencies are in the same general band and are of the same modulation type, they are still unordered. The slewing of a digital frequency synthesizer up and down in large increments slows the overall scan time because of the settling time. However, it is extremely inconvenient and unacceptable to expect an operator to insert every frequency in order when initially programming the scanning receiver. It is even more inconvenient and unacceptable to require this frequency ordering when reprogramming the receiver to insert another frequency in some band. This problem is significantly increased for scanning receivers which have coverage over a large number of bands and many frequencies within each band, i.e., those with larger memories.

SUMMARY OF THE INVENTION

The invention provides a scanning receiver with a multiplicity of scanning frequencies stored in a data base which can be programmed and manipulated with facility. The scanning receiver, in addition to its increased memory capability, has an increased bandwidth in which to scan the stored frequencies, and further has an increased scanning rate.

In accordance with one preferred embodiment of the invention, a microprocessor based receiver controller generates digital frequency selection codes for a digital synthesizer which provides a local oscillator signal. The local oscillator signal is produced by the digital frequency synthesizer through a phase locked loop which compares a representation of the input frequency selector code to the output of a voltage controlled oscillator. The control voltage for the voltage controlled oscillator s varied until its output frequency is phase locked and synchronized with the input frequency representation. The resulting local oscillator signal is then beat or mixed with incoming radio frequency signals from a receiver front end to select a particular channel. The selected channel signal is detected by conventional circuitry to provide an audio signal.

In accordance with the invention, the digital frequency selection codes that control the frequency synthesizer are stored in an Electronically Erasable Programmable Read Only Memory, or EEPROM, which provides massive random access storage for a minimum cost. The control frequencies for the receiver are stored in the EEPROM in frequency groups or banks. Each bank contains a plurality of frequencies which may be associated by use, band, geographic area, etc. These banks may be read into the random access memory (RAM) of the microprocessor to change its sets of scanning frequencies electronically.

In the scanning mode, the scanning receiver reads one bank of frequencies into its RAM at a time. After that bank of frequencies has been scanned, instead of writing the bank back to the EEPROM, it is cleared and the memory space in RAM overwritten with the next bank of frequencies. This technique has a number of advantages for a scanning receiver. First, all related frequencies are together in a set so that the frequency synthesizer does not have to slew between vastly different frequencies during a scan. Second, a nonvolatile medium, EEPROM, can be used which, although writable, is read much more often. Reprogramming because of battery or power failure is thus eliminated. Third, because only one bank of frequencies is read at a time, a much smaller amount of expensive RAM needs to be installed in the receiver controller.

According to one feature of the invention, the scanning mode is programmable as to the order in which the banks are scanned. A scanning list is formulated to allow from one bank to all banks to be scanned. The scanning list is formulated by linking or not linking each bank to the list. Within a bank, frequencies may be similarly linked or not linked.

According to another feature of the invention, the scanning mode is programmable to provide at least one bank with priority scanning. The priority bank is scanned once after every other linked bank in the scanning list.

According to still another feature of the invention, before the scanning frequencies of a bank are written to the EEPROM, either initially or when they are reprogrammed, the receiver controller sorts them in numerical order with the highest frequency first, i.e., in descending order. The normal scan direction is always from the highest linked bank to the lowest to extend the technique. This is advantageous during a scanning mode because the frequency synthesizer will always be slewing in the same direction, down in this case, rather than in different directions, significantly increasing the speed of scanning.

In accordance with yet another feature of the invention, the scanning receiver is provided with communications capability to a remote processor. Preferably, this can be a serial communication link to a personal computer system. The personal computer is provided with an interactive application program which can be used to control the scanning receiver from the input device of the system, usually a keyboard. The scanning receiver has complementary communication software and an application program for operating the receiver controller. A language set of commands, which emulate the receiver input device, is used to control the scanning receiver. The remote processor manages a data base which is an emulation of the receiver data base. The remote processor can upload banks, download banks and edit frequencies within banks thereby providing a powerful data base management capability. In this manner, frequency selection code memory becomes almost infinitely expandable as there is provided a remote means to store to and read the scan banks.

These and other objects, features, and aspects of the invention will become clearer and be more fully understood when the following detailed description is read in conjunction with the appended drawings wherein:

BRIEF DESCRIPTION OF THE DRAWINGS

FIG. 3 is a pictorial representation of the control panel of the receiver illustrated in FIG. 1;

FIG. 3A is a pictorial representation of the main menu for the application software of the remote processor illustrated in FIG. 1;

FIGS. 3B, 3C, and 3D are pictorial representations of depictions of monitor screen displays for the application menu illustrated in FIG. 3A;

FIG. 4 is a detailed block diagram of the receiver circuitry illustrated in FIG. 2;

FIGS. 11A and 11B are a detailed flowchart of the NEXT F routine of the software illustrated in FIG. 9;

FIGS. 19A–19M are a detailed flowchart of the communication module of the routine GETDATA illustrated in FIG. 10.

DETAILED DESCRIPTION OF THE PREFERRED EMBODIMENT

Figure 1:
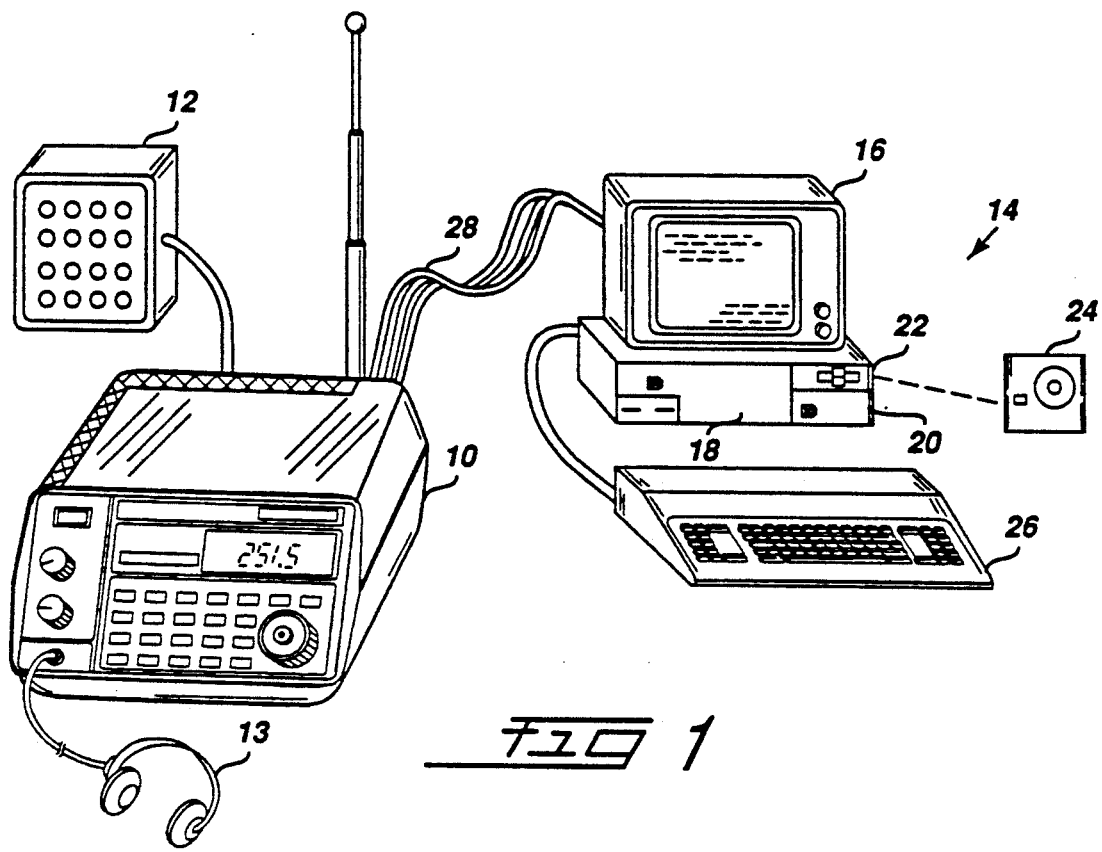
FIG. 1 is a pictorial representation of a receiver system, including a scanning receiver linked to a remote processor, which is constructed in accordance with the invention.

A scanning receiver system which is constructed in accordance with the invention will now be more fully explained with reference to FIG. 1. In that figure, a scanning receiver 10 is shown connected to an internal or external speaker 12 and/or headphones 13 for the purpose of receiving a broad range of frequencies and providing audio outputs from the selected channels. In the preferred implementation there will be described a broad banded receiver capable of tuning across channels from 5 MHz to 1500 MHz.

The receiver 10 in general has two modes which are scan and search. In the scanning mode, the receiver 10 will step through a selected group of channels and lock on to those channels which have broadcasts on them. In the search mode, the scanning receiver 10 will step between a starting frequency and an stopping frequency in discrete frequency steps to determine if any broadcasts are being made on those frequencies. The receiver also includes a manual mode in which particular frequencies can be chosen for reception and manual selection (tuning) can be accomplished.

The system further includes a remote processor 14 connected to the scanning receiver 10 by means of a communication link 28, shown as a ribbon cable. Preferably, the remote processor 14 can be a personal computer system of the conventional type which include PC, XT, or AT models, or compatibles, which run a PC-DOS or MS-DOS operating system, Version 2.0 or above. These systems, in general, include a video monitor 16 and a processor 18 including a hard disk drive 20 and a floppy disk drive 22. Interactive operator input to the remote processor 14 is developed from a standard keyboard 26. The remote processor 14 is adapted to run application programs from a floppy disk 24 which can be loaded from a floppy disk drive 22 onto the hard disk 20 of the system and then conventionally executed by the operating system by a system call. The remote processor 14, under control of an application program constructed in accordance with the invention, provides communication and database manipulation capability for the scanning receiver 10 as will be more fully explained hereinafter.

Figure 2:
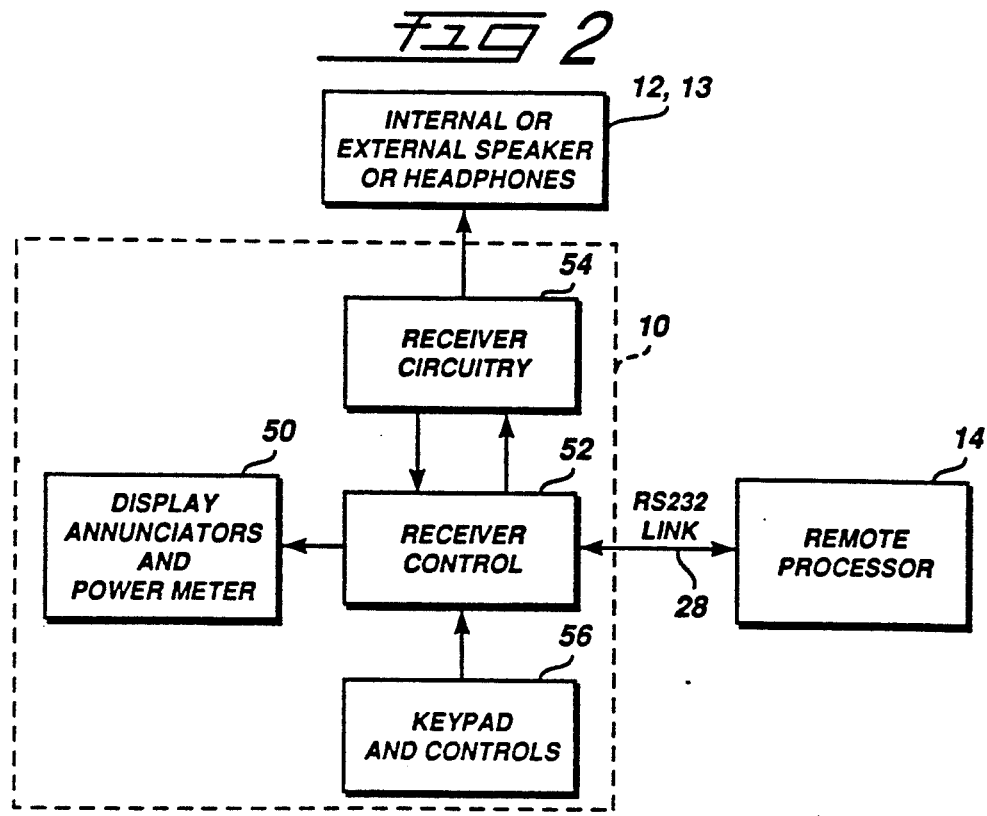
FIG. 2 is a system block diagram of the receiver system illustrated in FIG. 1.

A more detailed block diagram of the receiver 10 is illustrated in FIG. 2 which shows the receiver connected to the remote processor 14 by the communication link 28, preferably an RS-232 serial communication link. The receiver 10 includes a microprocessor based receiver control 52 which communicates with a plurality of peripheral devices including keypad and controls 56 and display annunciators and power meter 50. The keypad and controls 56 provide operator information to the receiver control 52, which outputs information to the display annunciators and the power meter 50 to inform the operator of a particular operating modes, receiver condition, and values of the operating parameters. The receiver control 52 further controls the frequency to which receiver circuitry 54 is tuned. The receiver control 52 provides control of the receiver circuitry 54 in a manner which takes into account not only the keypad and controls 56 information from the operator, but also the information communicated to the receiver control by the remote processor 14. The receiver circuitry 54 tunes to a selected channel and produces an audio output which drives the internal speaker, the external speaker 12, or the headphones 13.

FIG. 3 illustrates the control panel of the scanning receiver illustrated in FIG. !. The control panel contains both display annunciators and power meter 50 and the keypad and controls 56. The receiver 10 is turned on by a power switch 100 which is a push button operated switch having two positions, on and off. The receiver 10 further includes a squelch knob 102 which can be rotated to produce higher or lower levels of squelch in order to select the minimum signal strength for a received signal. A volume knob 104 is rotatable to produce varying levels of amplification from the output audio amplifier. In addition to the audio amplifier being connected to an internal speaker or the external speaker 12, a headphone jack 106 can be provided to facilitate listening by the headphones 13.

The remaining portion of the control panel of the receiver 10 is divided into a display region 108 and a keypad region 110. The display region 108 contains a plurality of annunciators and several LCD digit displays which inform the user of conditions and modes under which the receiver 10 is operating. A priority annunciator 112 is lighted when the receiver is in priority mode. When the receiver 10 is in priority mode and scanning the linked banks, the receiver will revert to scan bank 1 after scanning each other linked bank. A delay annunciator 114 is lighted when the unit is in a delay mode. In both the search and scan modes, the delay mode will cause the receiver 10 to pause longer after a channel has been received in the event a replay or a continuation of the call may be warranted. A lock annunciator 116 indicates that the scan frequency currently displayed is locked out of the scan list, i.e., it will not be received in the scan mode. A scan annunciator 118 indicates the receiver 10 is on a scan bank and is in the scan mode. A search annunciator 120 indicates that the receiver is in an auto-search mode in a search bank. A step indicator 124 is used to indicate which increments of frequency are being used in the search mode. The display will indicate either 5 KHz, 12.5 KHz or 25 KHz steps. The receiver has three reception mode indicators 126, 128 and 130 to indicate whether the reception mode is amplitude modulation (AM), narrow band frequency modulation (NFM), or wide band frequency modulation (WFM), respectively.

The frequency to which the receiver 10 is tuned is displayed in a seven digit LCD display having four digits 134 which indicate MHz and three digits 136 which indicate KHz. The receiver 10 has two LCD digits 13 which will display the bank number selected or the bank number scanned or searched. The scan banks are numbered from 1-62, while the search banks are numbered from 63-78. A key lock annunciator 138 indicates When the keypad 110 is locked out from controlling the receiver 10. As a final element in the display, a signal power meter 140 indicates, as a 10-unit LED bar display, the received signal strength of a particular frequency.

The control keys of keypad region 110 include twenty-two push button keys 142-184 and a rotatable knob 186. These keys and knob can be used to select the particular modes and operational functions for the receiver 10 and to select frequencies and banks. In addition, many of the keys have dual functions which are selected by first pressing the SHIFT key 176 to select the second function, before pressing a specific function key. Keys 142, 144, 146, 152, 154, 156, 166, 168, 170 and 178 are used to enter the digits 1-9, and 0, respectively. The NFM Key 142, after pressing the SHIFT key, will place the receiver into the narrow band FM mode for public service band listening. The WFM Key 144, when selected after the SHIFT key is pressed, will place the unit into the wide band FM reception mode which is used for broadcast FM or TV audio. The AM Key 146, when selected after pressing the SHIFT key 176, will place the receiver into the AM reception mode for frequencies below 30 MHz, 108-136 MHZ, and various other higher frequencies. The DELAY Key 148 will cause the receiver to add an additional pause before resuming searching or scanning. The MAN/SCAN key 150 is a toggle operation between the scan or search modes and the manual mode of operation.

The UP-ARROW Key 162 and the DOWN-ARROW Key 164 will cause the receiver 10 to move between frequencies. In scan banks which are not linked, hitting the arrow keys will move the receiver upward or downward among the frequencies in the bank. Holding these keys down will cause an automatic slew through the frequencies of the bank. When a scan bank is linked with other scan banks and the receiver is in a manual mode, pressing the DOWN-ARROW key 166 will allow the receiver 10 to slew through the remaining frequencies in the bank and then on to the next linked bank. Pressing the UP-ARROW Key 162 in linked banks will cause a slewing through the frequencies in the current bank and a wrap around within the bank. Moving the frequency selection knob 186 clockwise produces the same function as pressing the UP-ARROW Key 162, and moving the frequency selection knob 186 counterclockwise provides the same function as pressing the DOWN-ARROW Key 166. In a search mode, the arrow keys move the receiver frequency up or down to the next incremental frequency, i.e., the present frequency plus the selected step.

The Keys 152, 154 and 156 allow the selection of a 5 KHz, 12.5 KHz or 25 KHz frequency step, respectively, when they are pressed after selection of the shift key 176. The LOCK Key 158 serves to selectively lock out a frequency from a scan list when in the manual or scan mode by storing this information in the EEPROM. The frequency can be reinstated in the scan list by moving to that frequency in the manual mode and then again pressing the LOCK key 158. The lock indicator 116 will be lighted above the frequency when the frequency is locked out.

A LIGHT Key 160 provides side lighting for the LCD display and is toggled on and off by pressing this key. A LINK Key 166 and an UNLINK Key 168 provide for linking or unlinking banks, respectively by pressing these keys after the shift key has been selected. The bank number in the LCD display 132 will stay solid when the bank is linked and will flash when the bank is unlinked. A PRIORITY Key 170 allows the selection of the priority mode when this key is pressed, after the SHIFT key is selected. An ADD Key 172 and a DELETE Key 174 allow a frequency to be added or deleted in a current scan or search bank. If the LCD display indicates that the bank is full, a frequency must be deleted before another can be added.

A KEYLOCK Key 180 allows an operator to lock out input from the keypad 110. The key lock annunciator 138 will be lighted when the keypad 110 is looked out from reprogramming the receiver 10. A SELECT FREQUENCY Key 182 allows a direct access to a frequency by first inserting a frequency through the numerical digit keys and then by pressing this key. In a search bank and in the manual mode, the key 182 will cause a display of the upper and lower limits of the search range. In a search bank and in the auto-search mode, the key 182 will cause the search to revert to the highest frequency. In a scan bank and in the manual mode, pressing the key 182 will step through the stored frequencies and into the next bank, if the current bank is linked. No operation is performed when this key is pressed while the receiver is in a scan mode.

A SELECT BANK Key 184 allows a direct access to a bank by inserting the bank number with the numeric keys and then pressing this key. Manual steps for automatic slewing through all of the search banks and scan banks can be made with this key. For scan banks, pressing the key 184 will move the receiver to the next scan bank. For search banks, pressing the key 184 will move the receiver to the next higher search bank.

The operation of the remote processor 14 will now be more fully described with reference to FIGS. 3A, 3B, 3C, and 3D. The menu for the application program that runs the remote processor 14 as it appears on the screen of video monitor 16 is illustrated in FIG. 3A. The menu provides for two main functions which are (#1) data bank management and (#2) direct control of the receiver 10. Two auxiliary functions provide utilities for (#3) reformatting data base files from one format to another and for (#4) writing data base files to the banks.

Selecting the first option (#1) produces a screen display on the monitor 16 such as that represented in FIG. 3B. The application program running the remote processor 14 for bank management includes a storage area on the hard disk 20 that emulates the bank format of the receiver 10. Therefore, a screen is displayed which represents scan banks 1–62, which each hold 32 channels, and search banks numbered 63–78, which each hold 2 channels. In addition, there is provided a supplemental bank (FREQUEN) in which additional frequencies may be stored. No limit is imposed on the number of frequencies stored in FREQUEN bank except the amount of hard disk storage of the remote processor 14.

To edit the frequencies of the bank management program, the standard function keys of the keyboard 26 are used. The function keys move a highlight cursor around the screen to select one of the banks. The UP- and DOWN-ARROW keys move throughout the banks one at a time from bank 1 to FREQUEN and then start over again, or go backwards through the banks. PAGE-UP moves the highlight to the top of whatever column the highlight is presently in, and PAGE-DOWN moves it to the bottom of the column. The HOME key moves the highlight to bank 1 and the END key moves the highlight to FREQUEN. The operator may then press the ENTER key to select the highlighted bank and the frequencies of that bank will appear on the screen of the monitor 16 as depicted in FIG. 3C.

The frequency is the first entry, the second entry is the type of modulation, the third is the step size, and the fourth is a description (optional). For example, the first frequency has an entry of 162.5500 MHz, is narrow band FM, and has a step size of 5 KHz. As was the case for the receiver 10, a bank may contain up to 32 entries. The cursor highlights the first entry and moves around the screen based on the function keys of the keyboard 26. The CR (carriage return) key or DOWN-ARROW key moves the cursor to the next entry field of the channel. The UP-ARROW key produces a one field backward movement of the cursor. The CTRL-HOME keys move the cursor to the top left (first channel frequency) and the CTRL-END keys move the cursor to the description of the last channel.

The entry of channels into an edited bank can be accomplished in two ways. First, data can be typed directly into the data base using the keyboard 26. The program echoes the keystrokes on the screen of monitor 16 and fills the highlighted frequency slot. Again, the first entry is the frequency, the second entry is the modulation type, and the third is the step size of the frequency. Additionally, a description of the channel may be input.

The second method of entry for a channel slot is to load the frequency from the unlimited data bank FREQUEN. Data stored in this bank is available to all other 78 banks. A special function key, F10, is used to access the FREQUEN bank for this purpose. A window illustrated as overlaid on an edited bank screen is shown in FIG. 3D. Any frequency selection stored in the FREQUEN bank can be inserted into a frequency slot of an edited bank. As previously indicated, the PAGE-UP, PAGE-DOWN, UP-ARROW, and DOWN-ARROW keys can be used to highlight the frequency selection line in the FREQUEN display that the operator desires to insert. Pressing the carriage return (ENTER) will cause the frequency to be inserted into the line of the edited bank that was originally highlighted before the F10 key was pressed. The operation may be ended, or the program will return to the edited bank without selecting a frequency, if the ESC key is first pressed.

The remote menu scanner control option (#2) generally gives a blank screen from which a number of receiver commands can be generated. The commands are called by pressing the keys ALT-C on the keyboard 26. The screen will open a window which contains the commands illustrated in the receiver commands table listed below:

| RECEIVER COMMANDS | |
|---|---|
| AD | Add Frequency |
| AF [0/1] | Auto Frequency Mode |
| AM | AM Mode (AM) |
| DE | Delete Current Frequency |
| DL [nn] | Download Bank Command |
| DN | Down Arrow |
| DY [0/1] | Delay |
| EB [nn] | Erase Bank |
| FR [nnnn] | Tune to Frequency |
| KL [0/1] | Keyboard Lock |
| LI [0/1] | LCD Light On or Off |
| LK | Lock Out Frequency |
| LN | Link Bank |
| MA | Manual Mode |
| ME | Signal Strength Meter |
| NB [nn] | New Bank |
| NF | Next Frequency |
| PR [0/1] | Priority Mode |
| RF | Return Current Frequency |
| SC | Scan or Search |
| SR [nn] | Step Rate |
| UL [nn] | Upload Bank |
| UN | Unlink Bank |
| UP | Up Arrow |
| VR | Version Number |
| WM | Wide FM Mode |
| WT [nn] | Wait Interval |

Most of these commands are self-explanatory and follow the command sequences of similar functions for the keypad for the receiver control 52. Other commands are unique to the remote processor 14 and will be described in more detail. The auto-frequency mode command AF instructs the receiver 10 to return, through the communication link 28, the identity of each active frequency, its step rate and modulation, and signal strength. The information provided by the receiver 10 may be captured to the hard disk 20 by typing the function key F5 before issuing the AF command. On the bottom of the screen the message "COM.OUT" will appear along with the letter F indicating that an output file is active. The output file may be discontinued at any time by pressing the function key F5 again. The auto-frequency mode may be toggled off by again transmitting the AF command to deactivate the function.

The download bank command, DL, allows the remote processor 14 to use the bank management capability to store a bank of frequencies in the receiver 10. The program will convert the frequency data in the selected bank to the receiver format and load the EEPROM directly from the data base of the remote processor 14.

The upload bank command, UL, is similar to the AF command. It instructs the receiver to return frequencies. This command is used to store manually programmed frequencies of the receiver 10 into the memory of the remote processor 14. An output file can be opened by pressing F10 and then entering the command UL, followed by the bank number which the operator wishes to upload. The data will then be stored to the output file (COM.OUT). The bank data in banks 1-78 will be overwritten with the uploaded data, but the data will be added to the FREQUEN bank.

The wait interval command, WT, is used in conjunction with the AF command. A default timer is set for 10 seconds, and this command changes that default. In the AF mode, the receiver will automatically issue a DOWN-ARROW command changing the frequency after a predetermined interval. This interval will be changed to the number of seconds used in the command, from 1-99 seconds.

Further, there is a communication section to the second option (#2) which allows input to the scanner and output from the scanner. The display screen for this portion of the program is separated into a communications buffer which occupies the top 22 lines of the display for receiver output or keyboard output, and a second buffer for the keyboard input. The commands and cursor movement within the two buffers, the communications buffer and keyboard buffer, are illustrated in the two tables labeled "Communication Buffer" and "Keyboard Buffer".

| COMMUNICATIONS BUFFER | |
|---|---|
| Page Up | move the scroll window 'up' 20 lines in the 40 line buffer. |
| Page Down | move the scroll window 'down' 20 lines in the 40 line buffer. |
| Up arrow | move the arrow cursor up 1 line in the buffer |
| Down arrow | move the arrow cursor down 1 line in the buffer |
| Grey + key | move the window to the current output line in the buffer. |
| Grey − key | move the window to the first line of the 40 line scroll. |
| Ctrl-Home | clear the entire 40 line buffer and move to line 1. |
| F1 | turn on printer |
| Alt-F6 | display the keyboard buffer on screen when sent to receiver. |
| F5 | capture incoming data (and outgoing data if Alt-F6) to a file of choice. Enter the filename into the input buffer before pressing key or use the system default of COM.OUT (for capturing frequencies to be loaded into the bank management COM.OUT must be used). |
| KEYBOARD BUFFER | |
| Home | move cursor to the first position in the 160 character window. |
| End | move cursor to the last character in the 160 character window. |
| INS | allow character inserting (while typing) at cursor position. |
| DEL | delete character under cursor and shift rest of line to the left |
| Right Arrow (6 key) | move the cursor to the right |
| Left Arrow (4 key) | move the cursor to the left |
| Grey Left Arrow | destructive backspace |
| ESC | clear keyboard buffer completely (window only) |
| F9 | roll the last ten items sent to the receiver through the keyboard window. |
| Alt-F9 | roll the contents of the communication buffer through the keyboard window |
| F8 | clear all ten 'last sent items' |
| Alt-F8 | clear all ten Alt buffers |
| Carriage Return | send the keyboard buffer to the receiver with a return. |
| Ctrl-CR | send the keyboard buffer to the receiver without a return. |

The third option (#3) from the menu of the remote processor 14 is a conversion utility routine. The file that is used to capture output from the receiver is COM.OUT, but data in this file is not in a suitable format for being added to the data bases. It must be first converted into the data base format. The selection of option #3 on the main menu accomplishes this by a conversion routine and stores the reformatted output in a file named COM.TXT.

Once the frequency file COM.TXT has been formed, it may be added to any of the data bases with a utility routine called from the fourth option (#4) of the main menu. Upon selection of option #4, a prompt will ask the operator to enter the bank number or FREQUEN. Data can be added to the FREQUEN bank only from the file COM.TXT. The valid answers for the prompt are then FREQUEN or a number between 1-78.

With respect to FIG. 4, there is shown the detailed block diagram of the receiver circuitry 54. The receiver circuitry comprises in general a frequency synthesizer 200 which generates a local oscillator signal from a digital frequency selection code supplied from the receiver control 52. The local oscillator signal is used to beat against the incoming frequencies and tune to the channel producing the correct intermediate frequency (IF). The second main part of the receiver circuitry 54 is the main unit 202 which separates the frequencies into a high band and a low band and subsequently demodulates them into audio signals. The main unit 202 further provides for the development of squelch, volume control, and mode selection.

The main unit 202 comprises a radio frequency front end and first intermediate frequency stage 204, a second intermediate frequency stage 206 for wide band FM, a second intermediate frequency stage 208 for narrow band FM and AM, a second local oscillator 209, a mode switch 212, and an audio frequency gate and power amplifier 210.

The wide range of frequencies, 5–1500 MHz, which are received by the scanning receiver are input from an antenna 220 to the front end and first intermediate frequency stage 204. There they are separated into a high band from 800–1500 MHz by a high pass filter 222 and an RF amplifier 224 and into low band from 5–800 MHz by an RF amplifier 226 and a low pass filter 228. The selection of either the high band or low band is made by the H/L signal applied to amplifier 232.

The input frequencies are beat against a local oscillator signal from the frequency synthesizer 200 in a first mixer 230 which produces an output to intermediate frequency amplifier 32. For amplitude modulated signals the gain of the IF amplifier 232 is controlled by an automatic gain control AGC signal from the output of an automatic gain control buffer amplifier 275. This automatic gain control signal is further fed back to the receiver control 52 The high band frequency signals are amplified in the IF amplifier 232 and steered through a diode 234 before being input to the wide band FM IF stage 206 or the narrow band FM and AM IF stage 208.

The low band signals are also amplified in the IF amplifier 232 and steered through a diode 236 to a bandpass filter 238 and an additional intermediate frequency amplifier 240. The gain of the intermediate frequency amplifier 240 is further controlled by the AGC signal from the AGC buffer amplifier 275 and an AGC control amplifier 242. The low band frequencies further pass through a tunable filter stage 244 and into a second mixer 246. After being mixed with a second local oscillator signal, the second intermediate frequency is input to the wide band FM IF stage 206 or the narrow band FM and AM IF stage 208 through a diode 248.

The wide band FM frequencies are first passed through a diode 250 and a band pass filter 252 before being amplified in a series of intermediate frequency amplifiers 254 and 256. The output of the intermediate frequency amplifier 256 is received by a multifunction integrated circuit chip 258. The integrated circuit chip 258 contains a third oscillator and a third mixer which provide a second intermediate frequency for the wide band FM signals and thereafter another intermediate frequency amplifier prior to a discriminator. After discrimination and demodulation of the wide band FM signals, the output of the integrated circuit 258 is applied to a wide band FM de-emphasis and gating circuit 289.

The narrow band FM signals and the AM signals enter the IF stage 208 through a diode 262 which precedes a filter 264. After being filtered the signals are amplified in two IF amplifier stages 266 and 268. The gain of the two amplifiers is controlled by the AGC signal from the AGC buffer amplifier 275. After amplification, the signals are input to a multifunction integrated circuit 270. The integrated circuit 270 contains a third oscillator and a third mixer which provide a second intermediate frequency. The IC 270 contains a discriminator for demodulating the narrow band FM signals.

An output is taken directly from an IF amplifier of the integrated circuit 270 to a bandpass filter 272 for the AM signals. The amplitude modulated signals are amplified by a buffer amplifier 274 before being input to another multifunction integrated circuit 276. The integrated circuit 276 contains an intermediate frequency amplifier, an automatic gain control amplifier, and an amplitude modulation detector. The output of the AGC amplifier from the integrated circuit 276 drives the AGC buffer amplifier 275. After the AM signals are detected by the detector in the integrated circuit 276, the amplitude modulation signals are applied to a switchable gate amplifier 278.

The narrow band FM signals, after discrimination, are applied to a squelch detector 280 which receives as one input a variable voltage from the squelch knob 281. A squelch output is also fed back to receiver control 52. The narrow band FM signals are thresholded with the squelch detector 280 and thereafter input to a narrow band FM deemphasis amplifier 282. The output of the deemphasis amplifier 282 is input to a gate amplifier 284.

The outputs of the gate amplifiers 278, 284 and 260 are applied to a common audio frequency volume line which includes an audio frequency volume attenuator 286. The attenuator is a variable resistor controlled by the volume knob on the control panel of the scanning receiver 10. After volume control, the audio signal enters an audio frequency gate 288 which is controlled by gate amplifiers 292 and 294. The gate amplifiers have inputs from the squelch gate and the PLL lock signal. The audio signal passes through the audio frequency gate 288 when these signals are present. The output of the audio frequency gate 288 is the input to an audio frequency power amplifier 290 which provides the power necessary to drive external transducers such as the internal speaker 298 or an external speaker jack 296. Further, the headphone jack may be used as the output to the set of headphones 13.

The frequency synthesizer will now be more fully described with respect to the elements within block 200. The frequency synthesizer is based on the phase locked loop principal where a digital frequency selection code from the data signals and the clock signal from the receiver control 52 are input to a conversion circuit which converts the digital frequency codes into a representation of a frequency which is compared to the output frequency. When the frequency of the output is locked in phase and frequency with the input frequency, the frequency synthesizer 200 will output a PLL lock signal from the device 265. The output control signal of the device is generated from a buffer amplifier 247 which passes through a low pass filter 263 to an integrated circuit 257 which acts a voltage controlled oscillator.

Thereafter, the output frequency is filtered with a low pass filter 259 and amplified with several stages radio frequency amplifiers 261. The output of the radio frequency amplifiers is then coupled to the first intermediate frequency stage 204 as the local oscillator signal. A representative feedback of the output frequency is supplied to an RF amplifier 255 which scales the frequency down in a prescaler 253 before inputting it to an integrated circuit 251. The integrated circuit 249 accepts the output and compares it to the synthesized frequency from the digital input of the receiver control 52 before phase locking it and outputting the control signal to the buffer amplifier 247.

Figure 5:
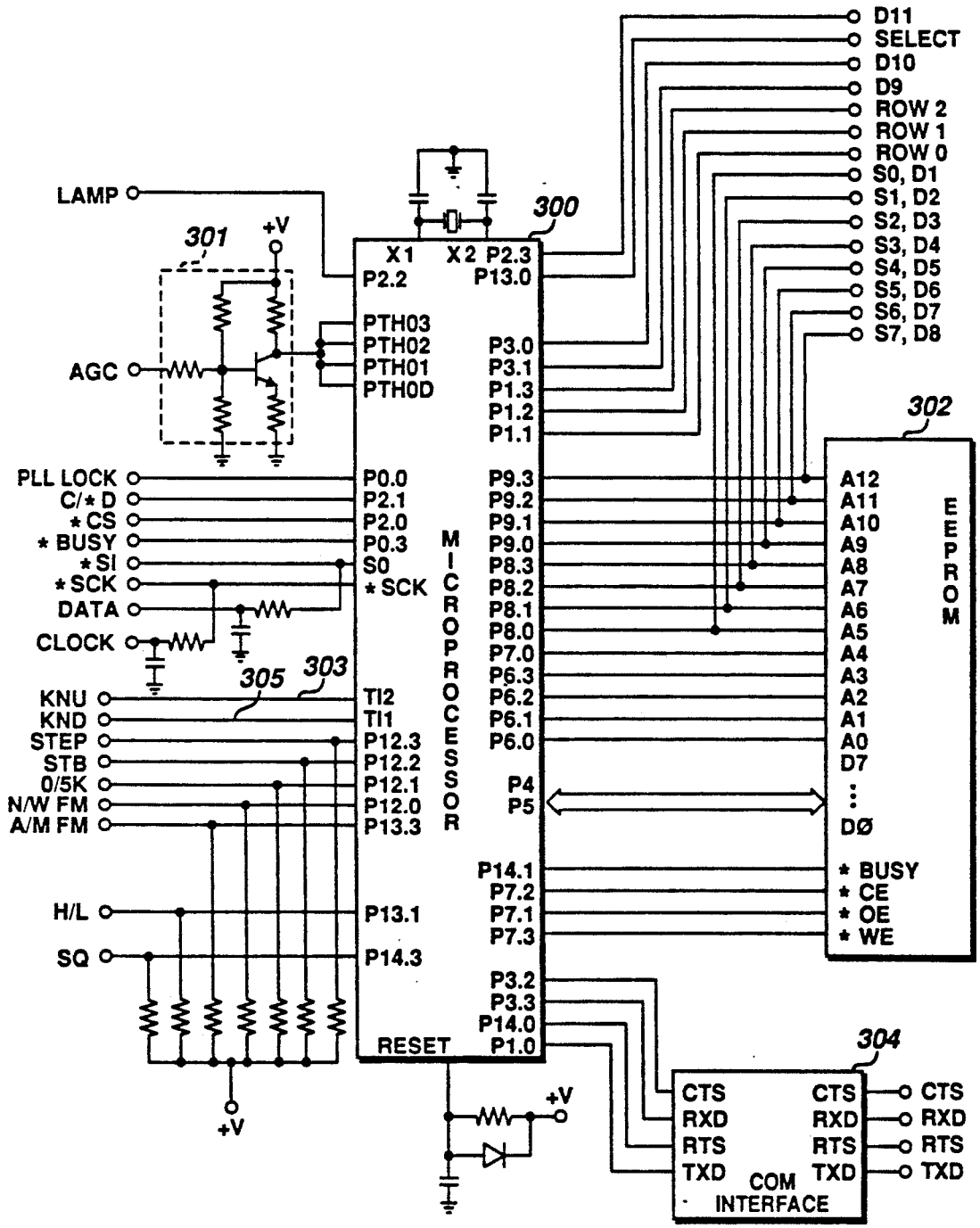
FIG. 5 is a detailed electrical schematic diagram of the receiver illustrated in FIG. 2.

The receiver control 52, more fully illustrated in FIG. 5, includes a microprocessor 300 which executes a control program stored in its internal read-only memory. The microprocessor has internal RAM and through the execution of the control program provides control signals and information signals to the peripheral devices of the scanning receiver 10. In general, as was described in FIG. 3, the functions of the microprocessor 300 are to control the receiver circuitry 54, communicate with the remote processor 14, provide display information to the LCD annunciators and power meter, and to receive inputs from the keypad and controls. In addition, the microprocessor 300 controls and alters the large data base stored in an electronically erasable programmable read only memory (EEPROM) 302. The EEPROM 302 is chosen as an external memory for the microprocessor 300 because of its mass memory capability at very low cost. Because of the configuration of the receiver control 52 and its operation, the EEPROM 302 is read much more often than it is written. This is an extremely advantageous solution to low cost mass memory for storing a large database for a scanning receiver control.

The microprocessor addresses the EEPROM 302 through an address bus, a data bus, and a control bus. The address bus includes port pins, P6.0–6.3, 7.0, 8.0–8.3, and 9.0–9.3 of the microprocessor 300 which are connected to the address inputs A0–A12 of the EEPROM 302. The data bus comprises a connection between the port pins P4.0–4.3, 5.0–5.3 of the microprocessor 300 and the D0–D7 inputs of the EEPROM 302. The data inputs D0–D7 and port pins are bidirectional and data flows on the data bus in both directions. Port pins P7.1–7.3, and P14.1 of the microprocessor 300 form a control bus and are connected to the busy output *BUSY, the output enable input *OE, the chip enable input *CE, and the write enable input *WE of the EEPROM 302.

To read data from the EEPROM 302 the microprocessor first enables the chip with a low level logic signal to the *CE input. Thereafter, the EEPROM 302 is tested to determine if it is busy by reading the *BUSY output of the device. If the EEPROM is not busy, then the microprocessor will load an address on the address bus to the address inputs A0–A12 along with a low level logic signal to the *OE input. This will cause the EEPROM to place the contents of the requested address on the data inputs D0–D7 for transfer to the microprocessor 300. The microprocessor 300 will then read in the data to memory from the input port pins P4.0–4.3, 5.0–5.3. A write cycle to the EEPROM 302 is similar except that, instead of a control signal for the *OE input, a write enable signal is applied as a low logic level to the *WE input and data is supplied on port pins P4.0–4.3, 5.0–5.3 to the data bus. The EEPROM 302 will then read in the data from the microprocessor 300 and store the data at the address selected on the address bus.

Figure 7:
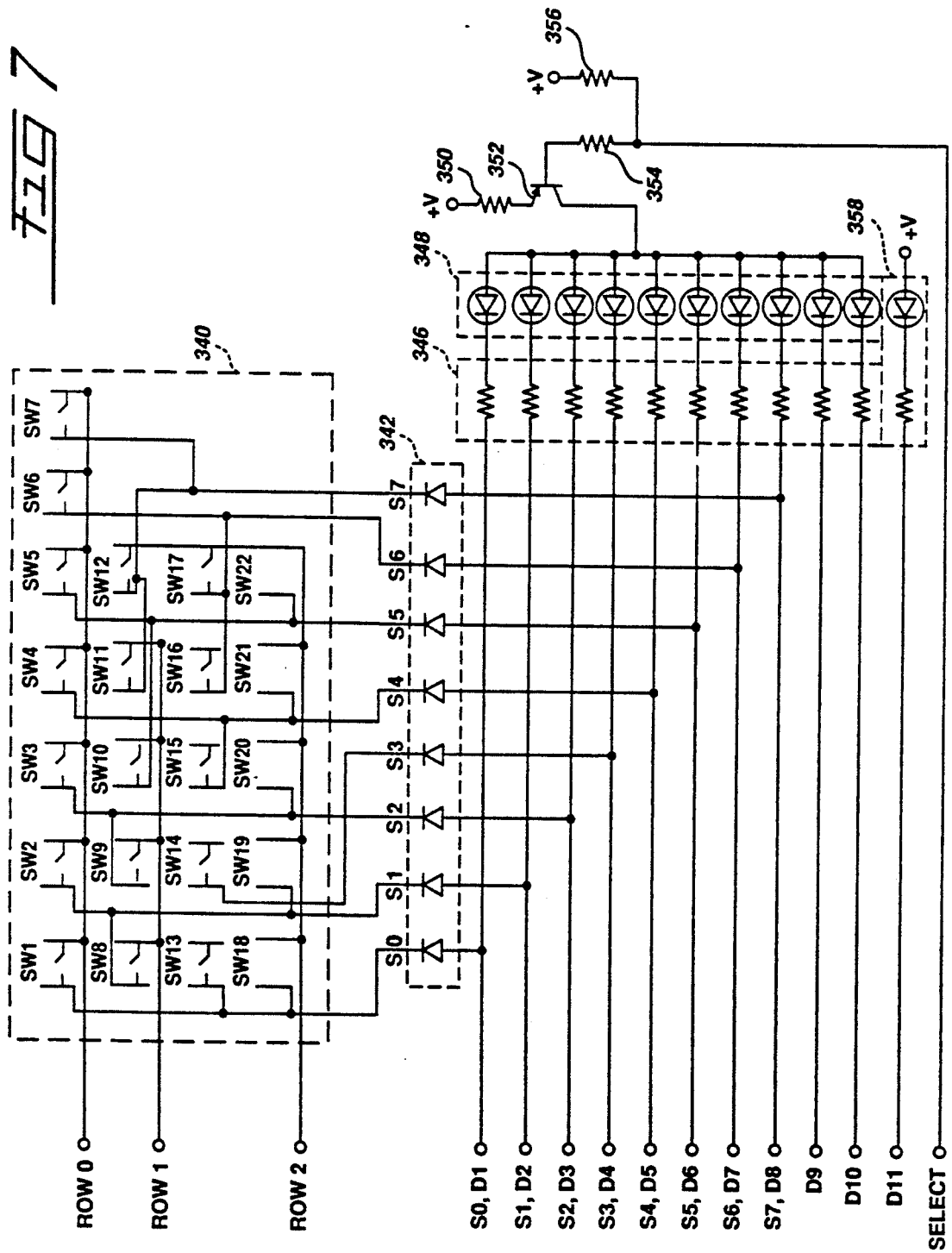
FIG. 7 is a detailed electrical schematic diagram of the power meter a keypad illustrated in FIG. 3.

The microprocessor 300 further controls the input of information from the receiver keypad which is represented in FIG. 7 as switches SW1–SW22 in the dashed block 340. Bidirectional port pins P1.1–1.3 serve to input signals ROW0, ROW1 and ROW2 from one side of the switches SW1–SW22. The other side of the switches SW1–SW22 are connected to different input lines of port pins P8.0–8.3, 9.0–9.3 which transmit signals S0–S7. By reading one of the ROW0–ROW2 lines and strobing a byte onto the S0–S7 lines, one bit at a time, the microprocessor 300 is able to tell which, if any, of the switches SW1–SW22 are closed or open.

The power meter is also illustrated in FIG. 7 as comprised of 10 LEDs 348 connected through ten resistors 346 to port pins P8.0–8.3, 9.0–9.3, and 3.0–3.1, respectively. Power is supplied for the LEDs 348 through a PNP transistor 352 having its emitter coupled to the power supply +V through resistor 350 and its collector connected commonly to the anodes of diodes 348. Bias for the transistor 352 is supplied through resistors 356 and 354 which connect its base to the positive supply +V. At the junction of the resistors 354 and 356, a select signal line is connected to port pin P13.0 of the microprocessor 300. The microprocessor 300 can light any of the LEDs of the power meter by first providing the select signal as a high logic level which supplies the LEDs with voltage. Any combination of the LEDs 348 may then be lighted by producing different combinations of the digital word D1–D10 on the port pins P8.0–8.3, 9.0–9.3, and 3.0–3.1 to sink current. The LED and resistor combination 358 connected between the source voltage V and port pin P2.3 is the lock out annunciator. The annunciator s lighted by providing a low logic level signal D11 on port pin P2.3.

It is noted that the keypad switches 340, the power meter and the EEPROM 302 all use some of the same port control pins. The microprocessor 300 provides the necessary multiplexing by disabling two of the devices while it is controlling the third. For example, when the EEPROM 302 is being read and written, the select line port pin P13.0 is held at a high logic level thereby disabling the power supply to the diodes 348 Further, because the ROW0–ROW2 port lines are not read, any signals on the common port lines mean nothing as keypad indications. Oppositely, when the power meter is lighted, the EEPROM 302 has a high logic level signal applied to its *CE input thereby disabling the chip. Further, the ROW0–ROW2 input lines are not read so that common signals on the switch lines are not misinterpreted. Finally, when the switches SW1–SW22 are read, a high level logic signal on the select line disables the power meter and a high level logic signal on the *CE input disables EEPROM 302.

Figure 6:
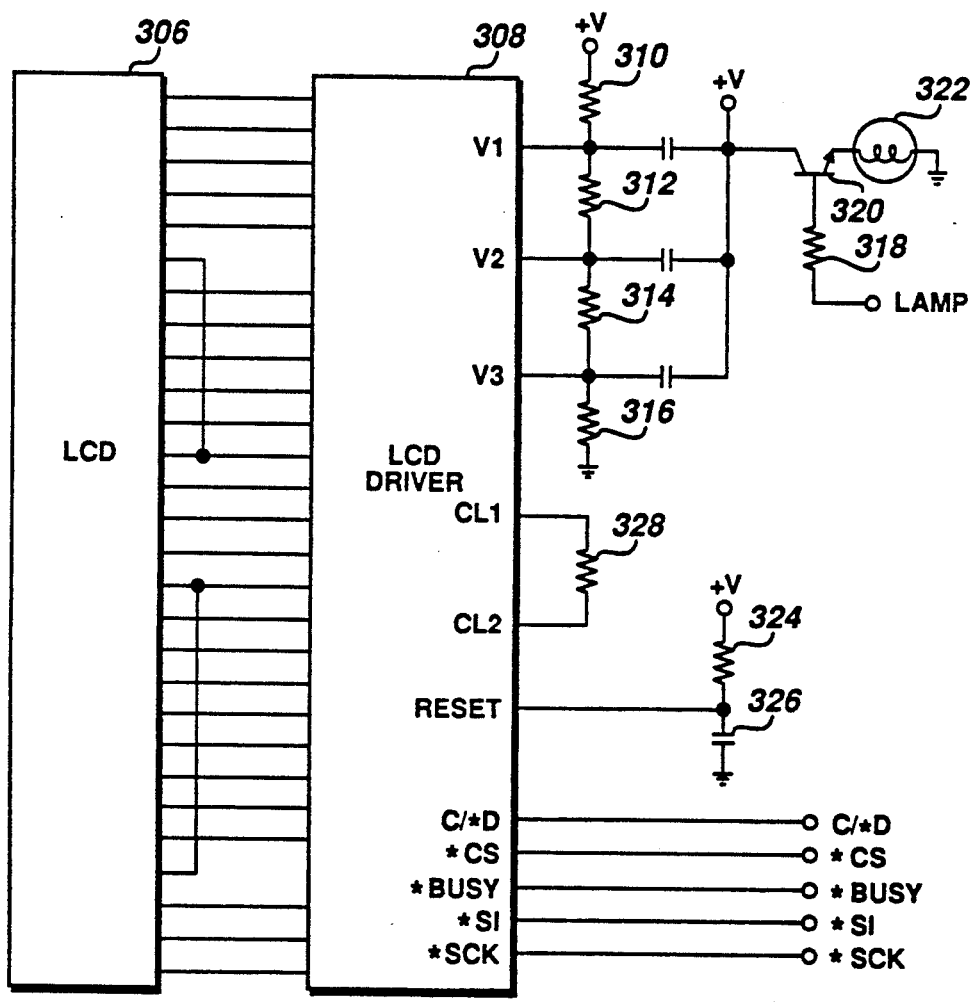
FIG. 6 is a detailed electrical schematic diagram of the LCD illustrated in FIG. 3.

The microprocessor 300 further controls the LCD display which is more fully illustrated in FIG. 6. The LCD display contains a specific purpose liquid crystal display chip 306 having electrodes configured as illustrated in the FIG. 3 and forming an integrated circuit which has segment inputs S1–S26 and common inputs COM0–COM2. The integrated circuit chip 306 is combined with an integrated circuit LCD driver chip 308 which has segment outputs S0–S23 connected to the inputs S1–S26 of the LCD chip 306. Further, the LCD driver chip 308 has common outputs CMO-CM2 which are connected to the common inputs of the LCD chip 306. The data indicating which of the electrodes should be displayed is from a serial data stream, and a clock signal from the microprocessor 300 which is supplied over port pins S0, SCK. These port pins connect to the *SI and *SCK inputs of the LCD driver 308. Before sending a new message to the LCD driver chip 308, the microprocessor 300 first selects the chip with a low logic level signal to its Chip Select input *CS. Thereafter, the microprocessor 300 determines if the chip is busy by testing its busy output *BUSY. If the LCD driver chip 308 is not busy, then a serial data stream from port pin S0 will be applied to the *SI input and clocked in at the rate of the clock signal on the output port pin *SCK. A LAMP signal from port pin P2.2 of the microprocessor 300 is used to operate the side lighting of the LCD by lamp 322. The logical levels of the signal turn the lamp 322 on or off via resistor 318 and transistor 320.

The microprocessor 300 further controls the receiver circuitry 54 through control signals on port pins P12.0–12.3, and 13.3. The STEP signal on port pin P12.3 is used to select the frequency step used in locking the frequency synthesizer 00. The strobe signal STB on port pin P12.2 is used to strobe in the data from port pin P3.0 into a register of the frequency synthesizer 200. Signals N/WFM and AM/FM on port pins P12.0, 13.3 are used to provide a two-bit digital word to the mode switch 212 of the main unit 202 of the receiver circuitry 54 for determining whether the reception will be narrow band or wide band FM, or AM.

The signal H/L on port pin P13.1 is used to select the front end signal of the receiver circuitry for high or low band reception. The SQ signal on port pin P14.3 is an input from the main unit 202 indicating that a signal has been detected in excess of the squelch. The output pins S0, *SCK of the microprocessor 300 are used to generate the signals DATA and CLOCK which when applied to the frequency synthesizer 200 to provide an output digital word selecting the frequency to be synthesized. When the receiver circuitry 54 has locked onto the synthesized frequency, it will report back to the microprocessor 300 with the PLL lock signal which in read in on port pin P0.0. In addition, the microprocessor 300 may read the AGC signal via a buffer amplifier 301 which is tied to the multiple analog to digital converting inputs PTH00–03 of the microprocessor 300. The information developed is used to operate the power meter. The frequency selection knob is configured as a pulse generator and supplies pulses on a signal line 303 when rotated clockwise and pulses on a signal line 305 when rotated counterclockwise. These signals, KNU and KND, respectively indicate whether the frequency selection knob is being rotated such that the receiver should be increased in frequency (KNU) or decreased in frequency (KND). These pulses are applied to the interrupt inputs T11, T12 of the microprocessor 300 which receives the pulses and decodes the direction by the presence or absence of the signals on the particular input pins.

The microprocessor 300 controls communications with the remote processor 14 by means of an interface circuit comprising an integrated circuit chip 304. The inputs and outputs of the IC 304 are standardized RS-232 serial interfaces. The IC chip 304 generally functions as a level shifter to provide a link between logic level inputs on one side and transmission level data on the other. The remote processor 14 easily interfaces with the link by means of its serial port, and microprocessor 300 easily interfaces with the link via its port pins. Serial data is transmitted conventionally on the transmit line, TXD or received on the receive line, RXD. The control lines clear to send CTS and ready to send RTS are used to indicate direction and availability of the devices and interface.

The communication protocol will now be more fully detailed. The microprocessor 300 and remote processor 14 communicate asynchronously through the interface at 300, 1200 or 9600 baud, with 8 data bits, no parity, and 1 stop bit. To prevent the receiver 10 from data overflow, the CTS line is used by the microprocessor 300 to acknowledge to the remote processor 14 that it is prepared to receive data.

To send data, the remote processor 14 first sends a signaling character, a space. The microprocessor 300 interprets the space as a request to send and discards it. In response to the space, however, the control program is executed to a point where the receiver is able to receive data and then it sends a CTS signal, thereby indicating that the remote processor 14 can begin the transfer. The receiver 10 automatically detects the baud rate by testing a string of characters (carriage returns) until the correct rate is found. It then replies with a CR/LF sequence. The TXD line is used by the remote processor 14 to transmit data. The TXD line is held in a "1" state during intervals between characters or words, and when no data is transmitting. The TXD line is held in a "1" state unless an "on" condition is present on the CTS line. The receiver 10, through microprocessor 300, transmits data to the remote processor via the RXD line. The RXD line is held in a "1" state between characters and when no data is transmitted. As long as the remote processor 14 is not transmitting, the receiver 10 assumes that the processor 104 is ready to accept data.

Figure 8:
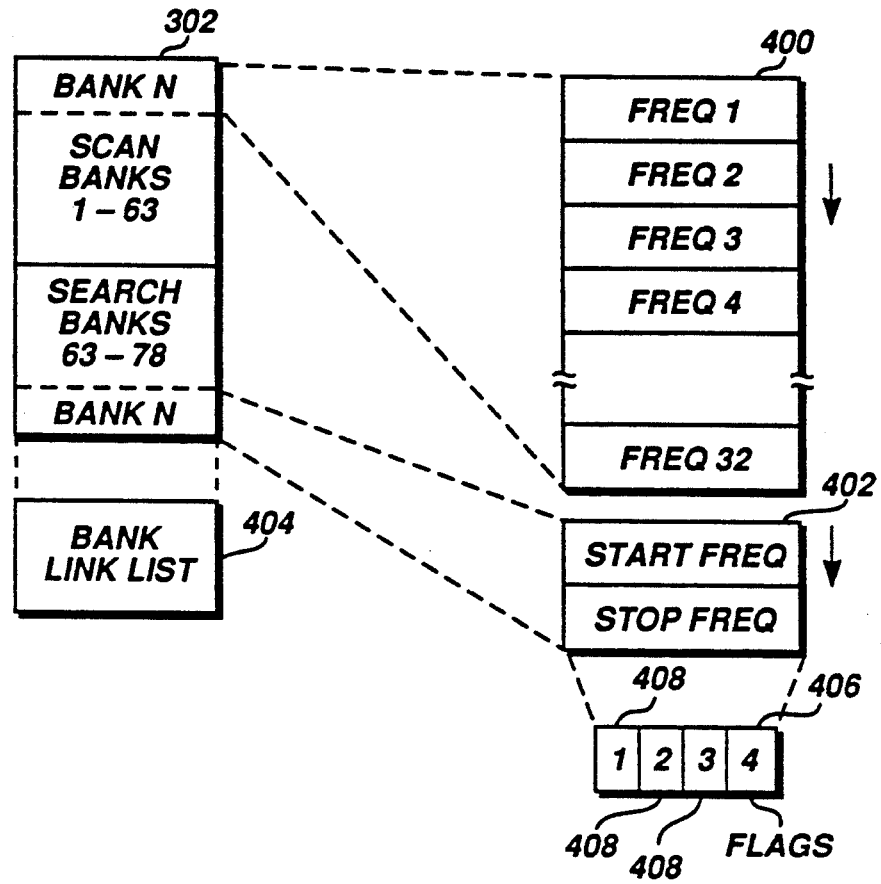
FIGS. 8A and 8B are a pictorial representation of the partitioning of the EEPROM illustrated in FIG. 5.

FIGS. 8A and 8B illustrate a mapping of the external memory or EEPROM 302 which is 8K×8 in size. The memory 302 stores a plurality of scan banks, in the preferred embodiment scan banks 1–63, and a plurality of search banks, in the preferred embodiment search banks 63–78. Each of the scan banks 400 include 32 frequencies. The frequencies are stored in descending order to provide the fastest scanning possible for the receiver 10. Each search bank 402 is comprised of two frequencies including a start frequency and a stop frequency which are stored in descending order. In addition, the EEPROM memory 302 stores a bank link list 404 which indicates which of the scan banks or which of the search banks are linked. The frequency information for each entry is stored in memory 302 as a pseudo BCD number occupying 4 bytes of data 408, 406. The least significant byte 406 contains mode information as illustrated in the associated flags table, and the most-significant three bytes 408 contain the frequency. The mode byte 406 is divided into modulation type, step size, and whether the frequency is locked out of a scan.

This provides an advantageous partitioning of the large memory which can store up to 2 K frequencies. Each of the banks may be linked in any order and can be prioritized to scan bank 1 as a most preferred bank. This storage method allows one bank at a time to be loaded into volatile memory (RAM) thereby reducing the amount of random access memory needed for the receiver control 54. Further, the partitioning of the large memory in this manner assists in the database management function of the receiver 10.

Figure 9:
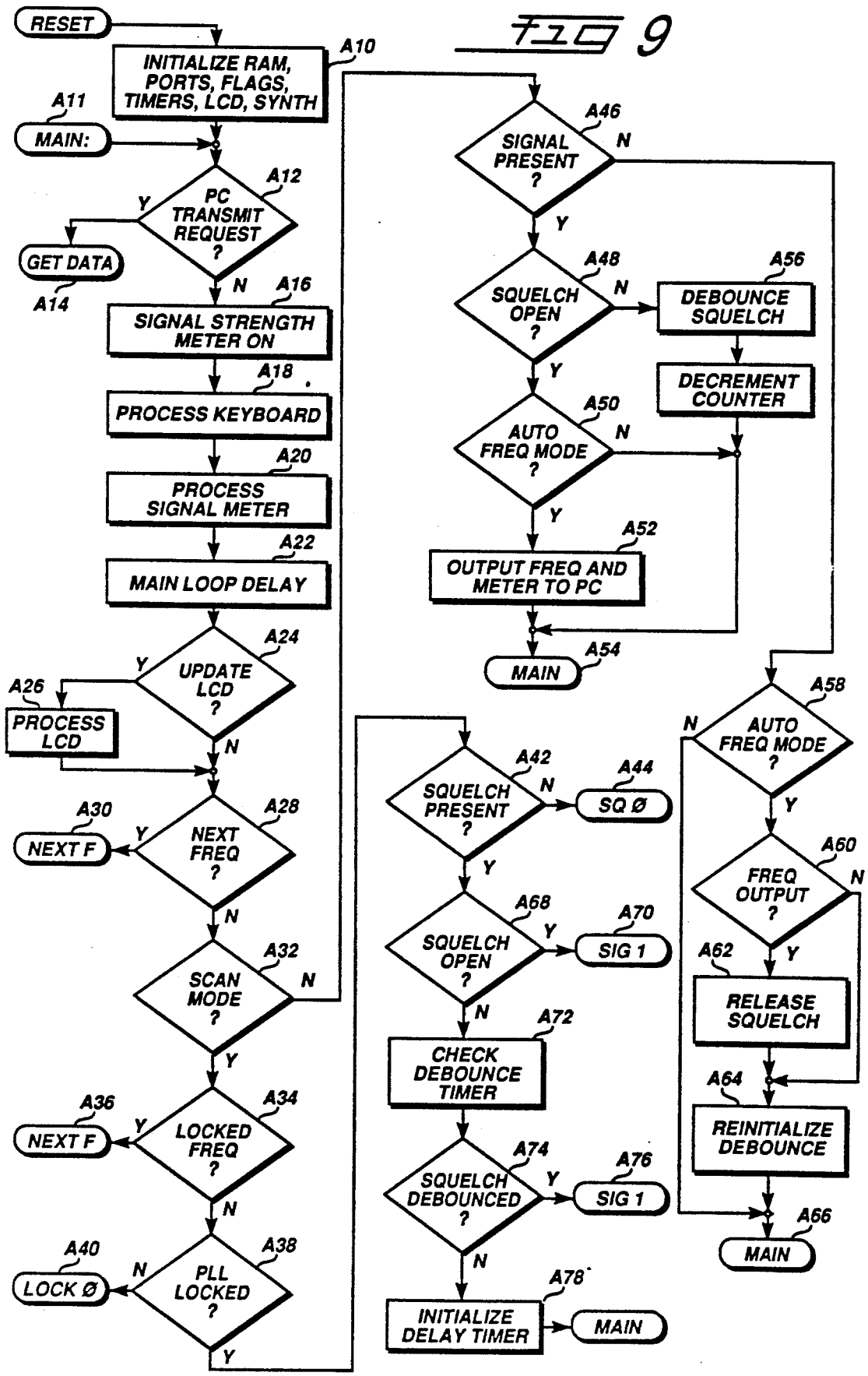
FIG. 9 is a system flowchart of the main loop control software which operates the microprocessor of the receiver controller illustrated in FIG. 4.

A detailed description of the flowchart of the main module of the control program which regulates the receiver microprocessor 300 will now be more fully described with respect to FIG. 9. In the first block A10, the RAM, the microprocessor ports, the flags, the timers, the LCD, and the synthesizer are initialized upon a reset signal to the microprocessor. This reset is generally applied on power up or at times when the system is out of synchronization. After the initialization procedure, the program begins the control loop at A11 with the address MAIN. The first procedure accomplished is to determine whether the remote processor 14 is requesting a transmission in block A12. If a request to transmit is found, then the program jumps to the GETDATA path headed by block A14 to get the data. Otherwise, the signal power meter is turned on in block A16, and the program begins processing the inputs and outputs to peripheral devices. The keyboard is first processed in block A18, and the signal meter is next processed in block A20. Thereafter, a main loop delay is counted in block A22 to equalize the time for passing through each of the iterations of the main loop. Thereafter, the program decides in block A24 whether there is a need to update the LCD display. If so, the system calls a processing routine which processes the LCD information and updates the display in block A26. Subsequently, the system decides whether it is ready to go on to the next frequency in block A28. When ready to step to the next frequency, the system calls a program NEXT F in block A30 which performs this function.

Otherwise, the system determines in block A32 whether or not the receiver is running in the scan mode. If the receiver is running in the scan mode, then a test is performed in block A34 to determine if the current frequency is locked out. If the current frequency is locked out, then the program NEXT F is called in block A36. If the current frequency is not locked out, then the program determines in block A38 whether the phase locked loop is locked. If the PLL is not locked, then a program LOCK0 is called in block A40. Alternatively, if the phase lock loop is locked, the program determines in block A42 whether or not squelch is present. If squelch is not present, then a program SQ0 is called in block A44. If squelch is present, then the program advances to block A68 where it is determined whether the squelch is open. If the squelch is open then a program SIGI is called in block A70. Otherwise, the debounce timer for the squelch is checked in block A72 and, in block A74, the result is tested to determine whether the squelch has been debounced. If the squelch has not yet been debounced then the initial capture delay time is set in block A78 and the program returns to the main loop at block A11. If the squelch is debounced, then from block A74 the program proceeds to the SIGI program in block A76.

Returning now to the point in the program at block A32 where it is determined whether the scanner mode is active, the previous path has described when the functions of the program when the scan mode is operable, while the next path will describe the path when the scan mode is inactivated. This path begins at block A46 where it is determined whether or not squelch is present. If there is squelch present, then in block A48 it is determined whether or not squelch is open. If squelch is not open, then the squelch is debounced in block A56 before returning to the main loop in block A54. If the squelch is open, then a path to block A50 is taken to determine whether the receiver is in an auto-frequency mode. If the receiver is not in an auto-frequency mode, the program returns immediately to the main loop through block A54. If an auto-frequency mode is detected, then the program path is to block A52 which outputs this present frequency and the power meter reading to the remote processor 14. After block A52 is accomplished, the program returns to the main loop in block A54. The alternative path from block A46, when squelch is not present, causes a transfer to block A58 where it is again determined whether the receiver is in an auto-frequency mode. If the receiver is not in an auto-frequency mode, then the program returns to the main loop immediately through block A66. Alternatively, if the receiver is in an auto-frequency mode, then in block A60 it is determined whether the frequency went out, i.e., whether the present frequency was output to the remote processor. If it did, then the squelch is released in block A62, and a reinitialization of the squelch debounce is performed in block A64. If the frequency did not go out, then the program returns immediately through block A66 to the main loop.

Figure 10:
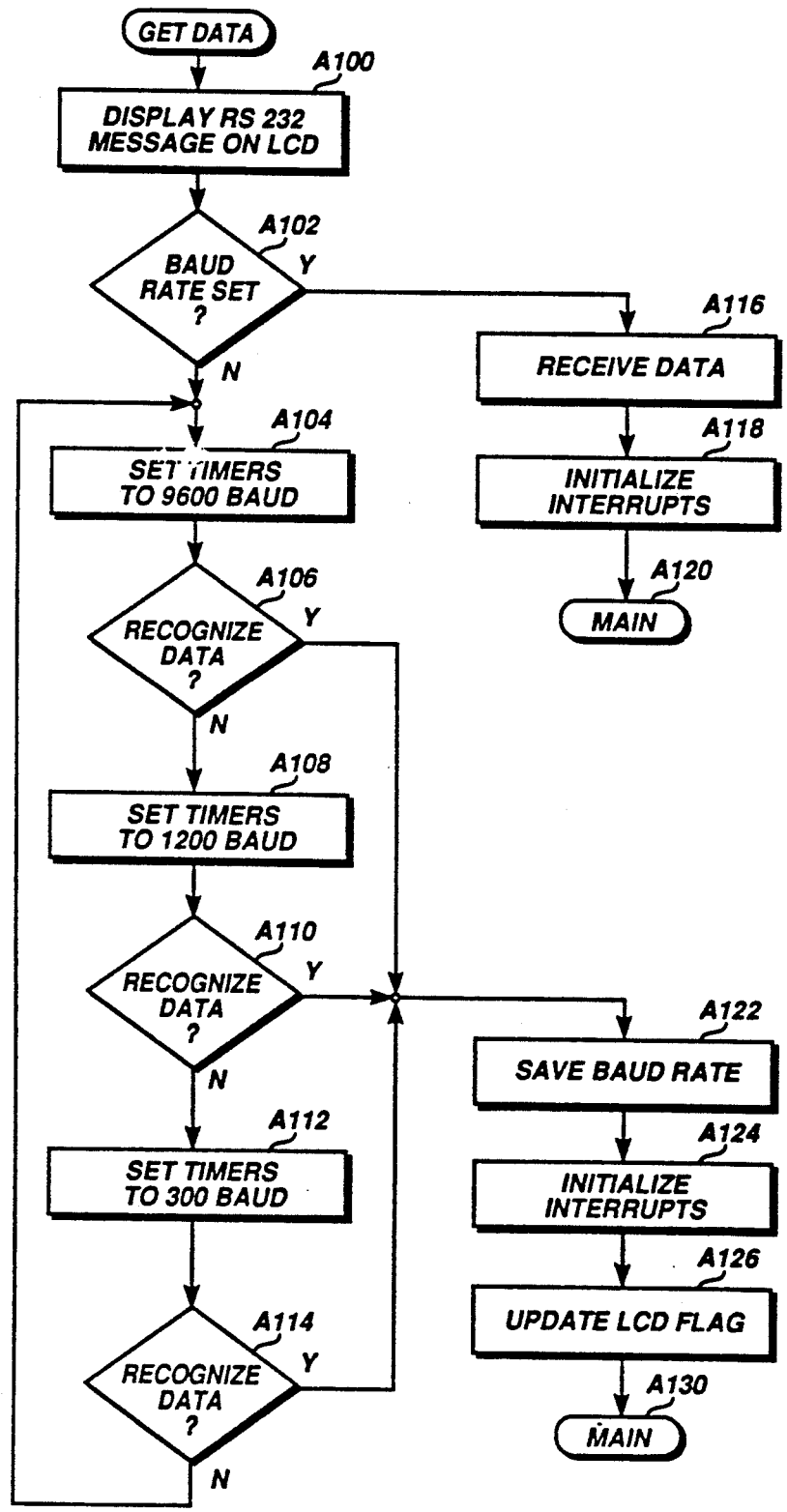
FIG. 10 is a detailed flowchart of the GETDATA routine of the software illustrated in FIG. 9.

The program GETDATA will now be more fully explained with reference to the flowchart in FIG. 10. The program GETDATA performs the two functions of obtaining messages from the remote processor and setting the baud rate for the communications. The remote processor may transfer data at any of a number of standard baud rates including 300 baud, 1200 baud or 9600 baud. The program will recognize the message rate and then receive the data to provide communications between the remote processor and the receiver. Initially, the program begins in block A100 by displaying a message on the LCD that the receiver is in a RS232 communication mode. Next, the program in block A102 checks to determine whether the baud rate for communications between the remote processor and the receiver has been set. If the baud rate has been set, then the communication program receives the data in block A116 before initializing all interrupts in block A118. The program then returns to the main program loop in block A120.

Otherwise, if the baud rate has not been set, then the program initialize the timers of the communication program to 9600 baud in block A104. The communication program determines whether or not the data is recognizable in block A106. If it is not, then it continues to block A108 to initialize the program timers to 1200 baud. The recognize data step is again performed in block A110 and, if negative, the timers are initialized to 300 baud in block A112. Another step in block A114 is taken to recognize the data, if the data is not recognized in block A114, and then a loop is formed until one of the standard data rates is recognized. Upon the recognition of a standard data rate in block A106, A110 or A114, the program will transfer control to block A122 where the recognized baud rate is saved in memory. The timer interrupts will be initialed in block A124, and the LCD is updated in block A126 before the program exits to the main loop in block A128.

Figure 11B:
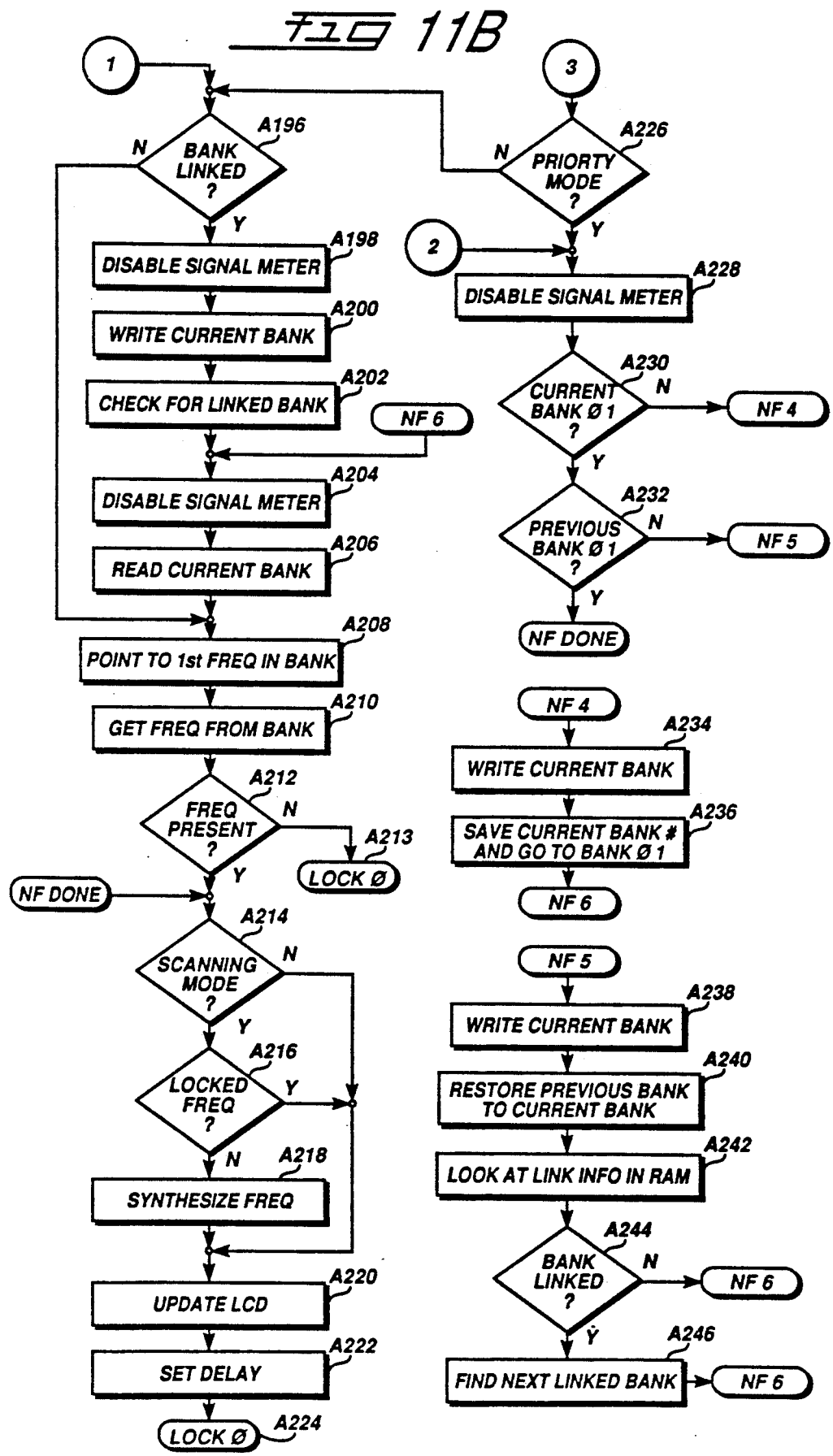

The functions of the program NEXT F will now be more fully described in detail with respect the flowchart in FIGS. 11A, 11B. The program NEXT F is a routine to find the next frequency which is to be set up in the receiver 10. The program begins in block A150 where it is determined whether the receiver is in the auto-frequency mode. If not, then the program jumps directly to block A56. If the receiver is in the auto-frequency mode, then block A152 is executed to determine whether the frequency has gone out. If the frequency has gone out, then the squelch release function is performed in block A154 before taking a path to block A156. If the frequency has not gone out, then a direct path to block A156 is taken.

Beginning at block A156, a path is performed to find the next frequency. Initially, the LCD display flag is updated and a new frequency is acknowledged in block A158. Then in block A160 it is determined which new frequency mode, either the scan mode or search mode, that the receiver is in. If the receiver is in a search mode, then the program SEARCH is called in block A162. Otherwise, if the receiver is in the scan mode, then block A164 is executed to determine whether the receiver is going forward in the frequency bank. If the receiver is going forward, then the next frequency in the bank is selected in block A166 and in block A168, a determination is made if this is the end of a frequency bank. If not, then a transition to block A180 is made to save the position in the bank. Thereafter, in block A182 the receiver gets the frequency and determines whether the frequency slot is empty in block A184. If the frequency slot is not empty, and the receiver is not at an end of the bank, as tested for in block A186, then the program progresses to block A188. In that block, a check is made to determine if the receiver is in a scan mode, and in the next block a test is performed to determine whether the current frequency is locked out. If the receiver is running in the scan mode and the current frequency is not locked out, then the frequency is synthesized in block A192. If the receiver is not in the scan mode, or the current frequency is locked out, then the program takes the alternative route to the LOCK0 program in block A194.

If, in block A164, it is determined that the receiver is not going forward in a frequency bank, then in block A172 the program decrements to the previous frequency in the bank. Thereafter, in block A174 the frequency is obtained and checked in block A176 to determine whether the frequency slot is empty, i.e., nonzero. If the slot is not empty, then a jump is made to block A188 where the frequency is synthesized through the path previously described for blocks A188-A194. If the slot is empty, then the program jumps directly the LOCK0 program in block A178.

For those instances where the program determines that a receiver is at the end of a frequency bank in A168, the program path will continue to block A170 to determine whether the priority mode is set. If the priority mode is set, then the program will jump to block A228 (FIG. 11B) to disable the signal meter before executing block A230 to determine whether the current bank is bank 1. If the current bank is bank 1, then the program in block A232 will determine whether the previous bank was bank 1. If the result of this determination is affirmative, then the program will jump to block A214 via the NF DONE path. Otherwise, if the current bank in block A230 was not bank 1, the changes for the current bank, if any, are written back to EEPROM in block A234 via the NF4 path. The current bank number is then saved and replaced by bank 1 in block A236, and the program then jumps to block A204 via the NF6 path.

Alternatively, if the previous bank in block A232 is not bank 1, then the current bank changes, if any, are written to the EEPROM in block A238 via the NF5 path. Thereafter, the previous bank number is stored in the current bank number in block A240, and it is determined whether the current bank is linked in the bank chain in blocks A242 and A244. If the current bank is linked, then the program jumps directly to block A204 via the NF6 path. If the current bank is not linked, then the program determines the next linked bank and makes that bank the address of the current bank in block A246 before continuing to block A204.

Returning now to blocks A168 and A170, if the program finds that it is an end of a bank and the priority is not set, then the program will continue at block A196 where the linkage of the current bank is determined. If the current bank is not linked, the program will continue at block A208. If the current bank is linked, then the power meter is disabled in block A198 and the current changes to the bank are written to the EEPROM in block A200.

Alternatively, if the priority is not set in block A170 or the priority mode is not set in block A226, then a path beginning with block A196 and ending with block A224 is entered. In this path, the program again determines if the current bank is linked in block A196. If the current bank is linked, then the LCD meter is disabled in block A198 and the current bank changes, if any, are written to the EEPROM in block A200. Next, a check for the next linked bank is done in block A202 before the signal meter is disabled in block A204. At this point, the current bank can be read in block A206, and the first frequency in the bank is pointed to in block A208. The program then gets the contents of the frequency slot that is pointed to in block A210, and tests it to determine whether it contains a frequency in block A212. If there is no frequency present, then the program exits to LOCK0 in block A213.

If a frequency is present, then the program continues to determine if the scanning mode is set in block A214, and whether the frequency is locked out in block A216. If the receiver is in the scanning mode and the frequency is not locked out, then the frequency is synthesized in block A218. Otherwise, if either the scanning mode is not set or the frequency is locked out, then the program immediately jumps to block A220. In block A220, the LCD is updated and a delay se in block A222 before exiting to LOCK0 in block A224.

Figure 12:
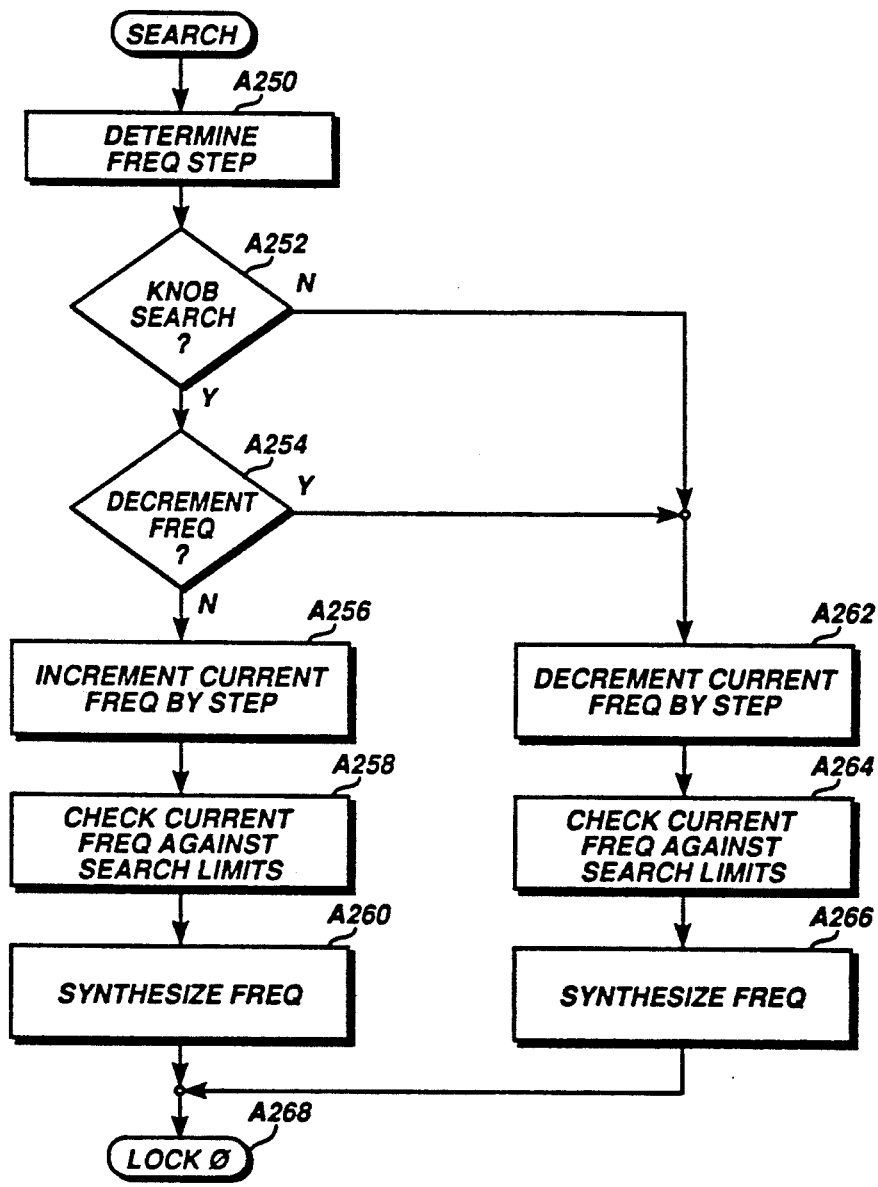
FIG. 12 is a detailed flowchart of the SEARCH routine of the software illustrated in FIG. 10.

The program SEARCH will now be more fully explained with reference to the detailed flowchart in FIG. 12. Initially, at the start of the frequency search program in block A250, the step count of the program, i.e., either 5 KHz, 12.5 KHz or 25 KHz, is read to determine how to calculate the next frequency. Thereafter, it is determined whether this will be an automatic search or a search from the frequency knob in block A252. If it is a knob search, then in block A254 it is determined whether the knob is decrementing the frequency or incrementing the frequency. If the frequency selection knob is decrementing the frequency, or if it is not a frequency selection knob search, then in block A262 the current frequency is decremented by the predetermined frequency step. Thereafter, in block A264, the current frequency is checked to determine that it is within the search limits. If within the search limits, the frequency is synthesized and output in block A266 before exiting to the LOCK0 program in block A268. If the search is from the frequency knob and the frequency knob is incrementing, then the program will transfer control of the program to block A256 where the current frequency is incremented by the frequency step. The frequency is then checked to determine whether it is within the search limits in block A258. If the frequency is within the search limits, then it is synthesized and output in block A260 before exiting to the LOCK0 program in block A268.

Figure 13:
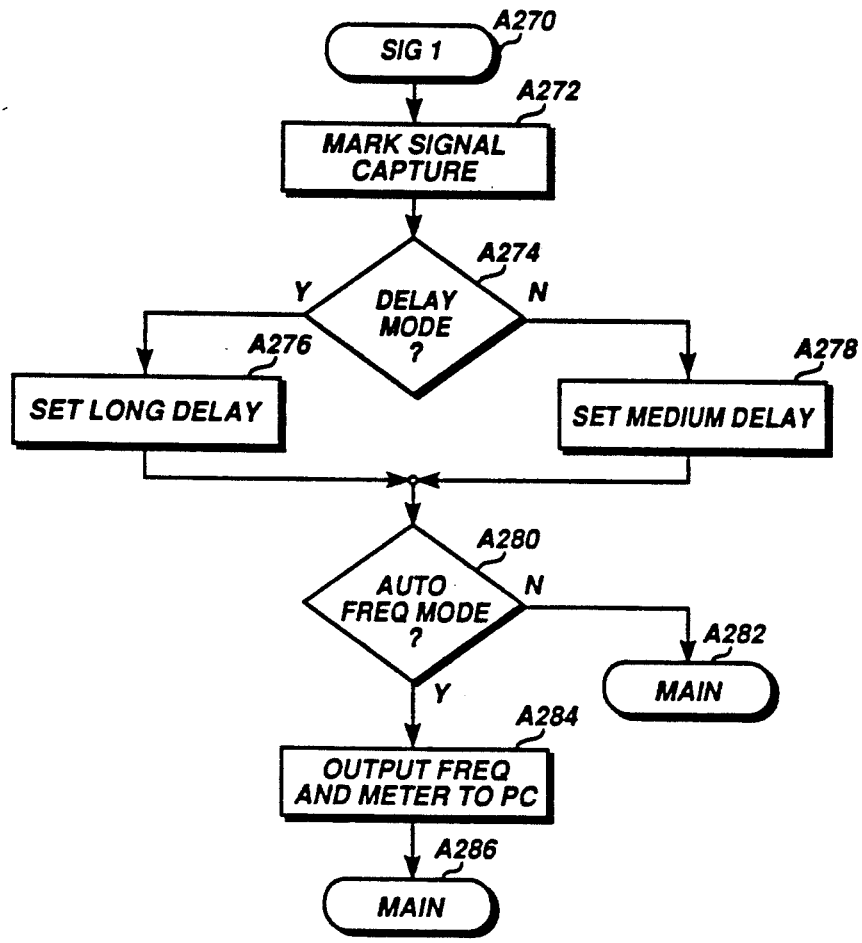
FIG. 13 is a detailed flowchart of the SIGI routine of the software illustrated in FIG. 9.

The detailed flowchart for the SIG1 program will now be more fully explained with respect to FIG. 13. The SIG1 program initiates in block A272 to mark a signal capture. Next, in block A274, the receiver 10 is checked to determine whether or not it is in a delay mode. If it is in a delay mode, then a long delay is set in block A276 and, if not in a delay mode, a medium delay is set in block A278. Both paths converge at block A280 where is it determined whether an auto-frequency mode is set. If the auto-frequency mode is not set, the program returns immediately to the main loop through block A282. If an auto-frequency mode is set, then the output frequency which is captured is sent to the LCD display. The output frequency and the power meter are further output to the remote processor in block A284. The program will then exit to the main loop in block A286.

Figure 14:
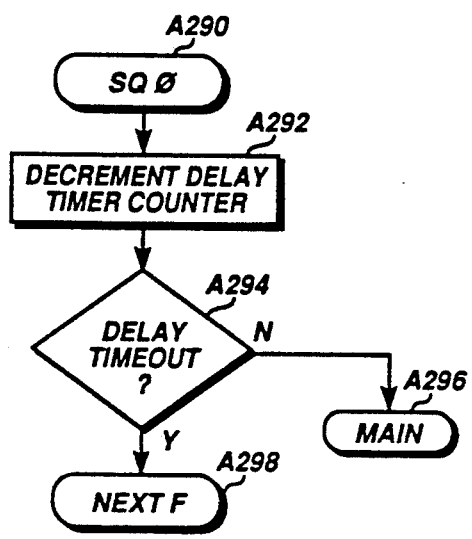
FIG. 14 is a detailed flowchart of the SQ0 routine of the software illustrated in FIG. 9.

The SQ0 program will now be more fully explained with reference to FIG. 14. Initially, in block A292, the delay counter is decremented, and the time out for the delay checked in block A294. If the delay time out is present, then the program jumps to the next frequency program NEXT F in block A298. Otherwise, if no delay time out has been sensed, the program will return to the main loop in block A296.

Figure 15:
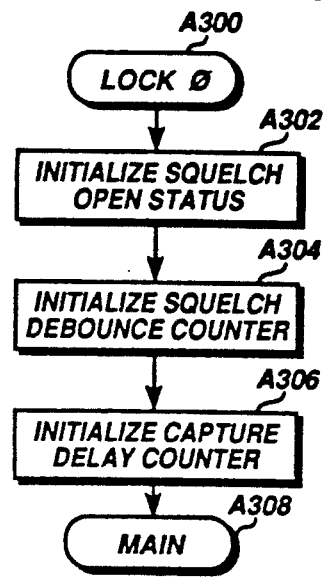
FIG. 15 is a detailed flowchart of the LOCK0 routine illustrated in 9.

The LOCK0 program will now be more fully described with reference to the detailed flowchart illustrated in FIG. 15. The initial step in the LOCK0 program is to initialize the squelch open status in block A302. Thereafter, the squelch debounce counter is initialized in block A304, and the capture delay counter initialized in block A306. After these initialization steps have been accomplished, the program exits to the main loop in block A308.

Figure 16A:
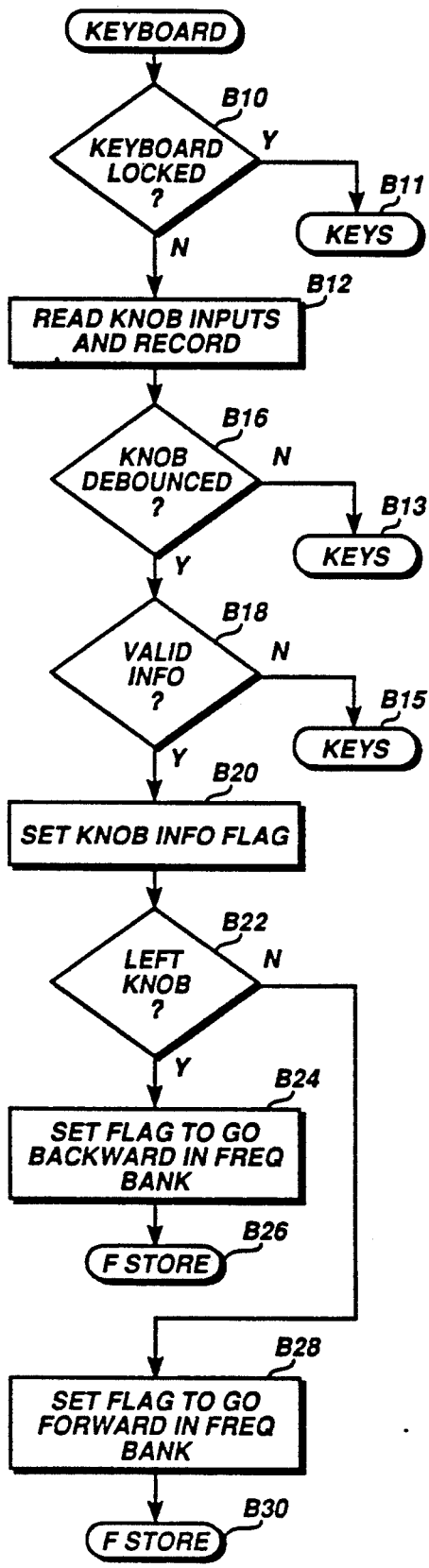
FIGS. 16A–16E are a detailed flowchart of the keypad module software of the main loop line illustrated in FIG. 9.
Figure 16B:
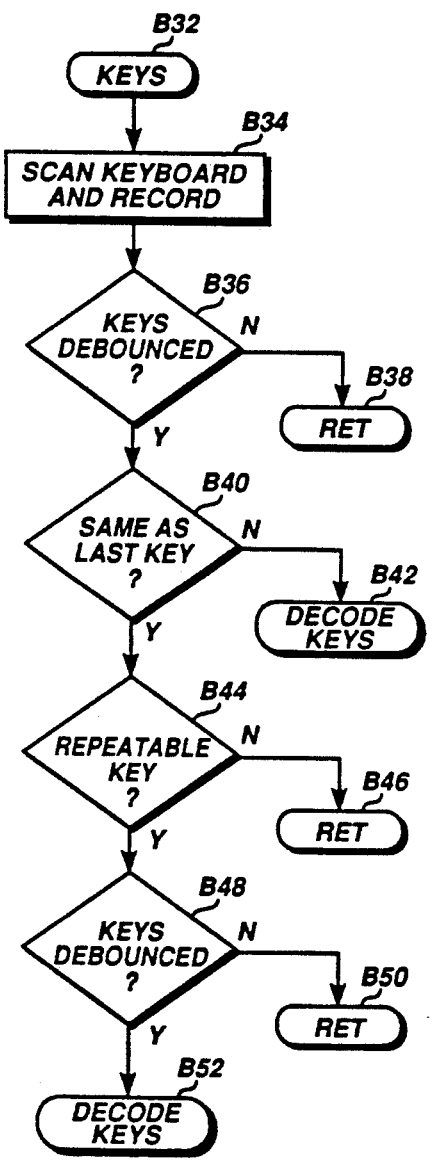
Figure 16C:
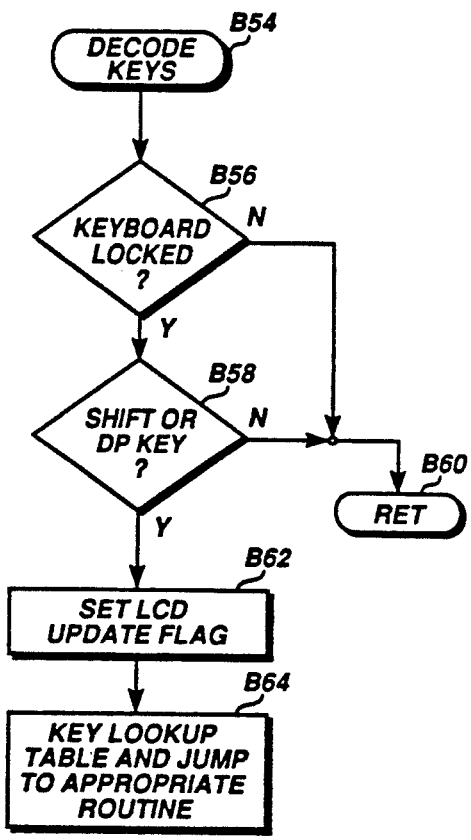
Figure 16D:
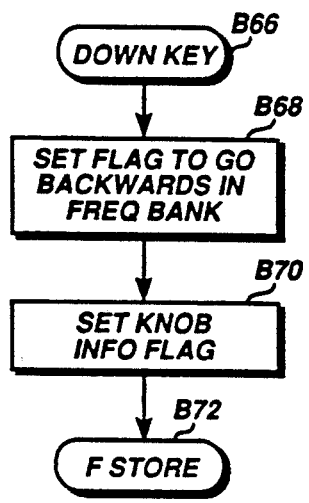
Figure 16G:
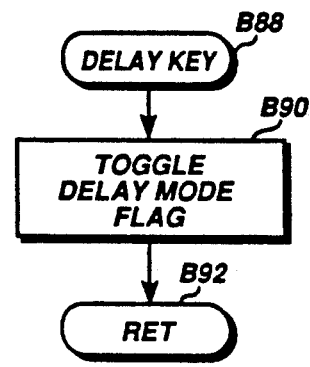
Figure 16E:
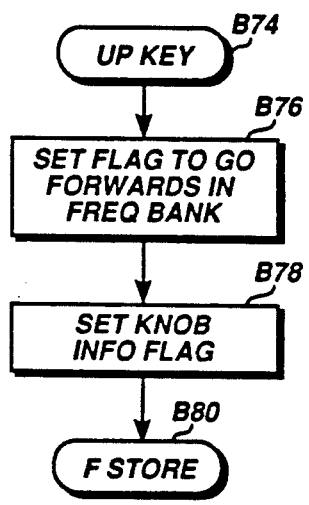
Figure 16H:
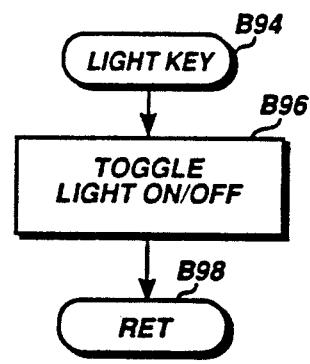
Figure 16F:
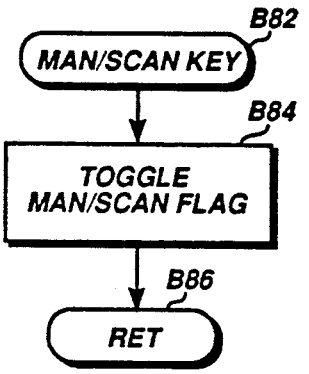
Figure 16K:
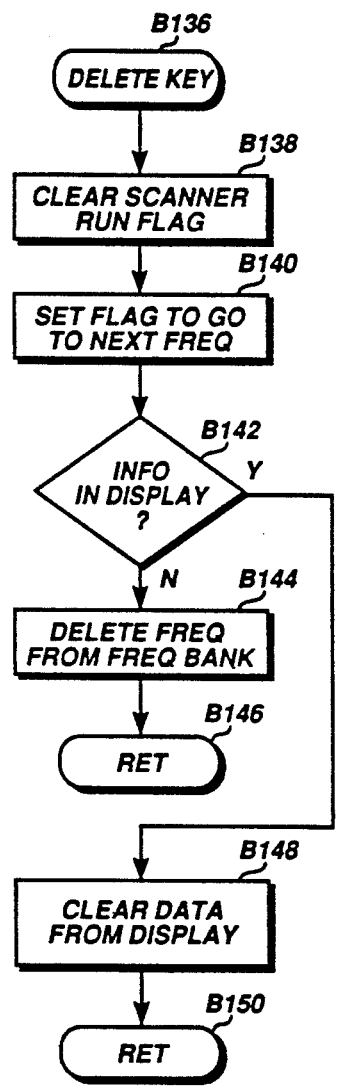
Figure 16L:
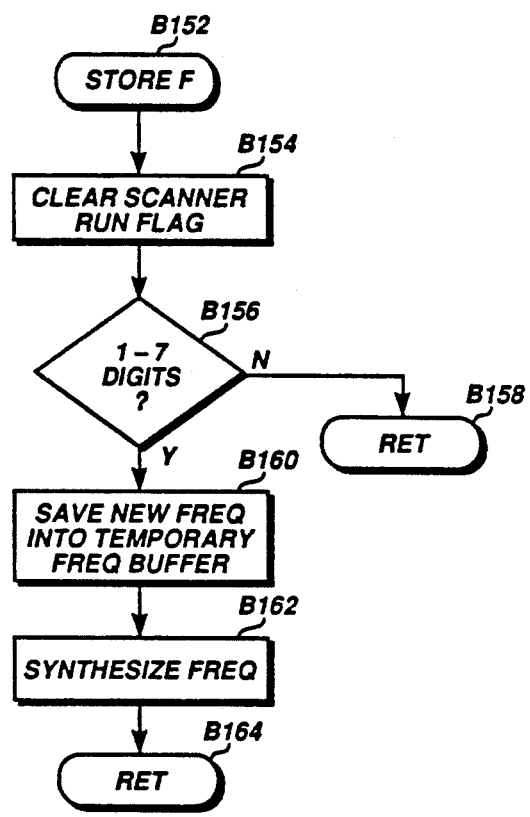
Figure 160:
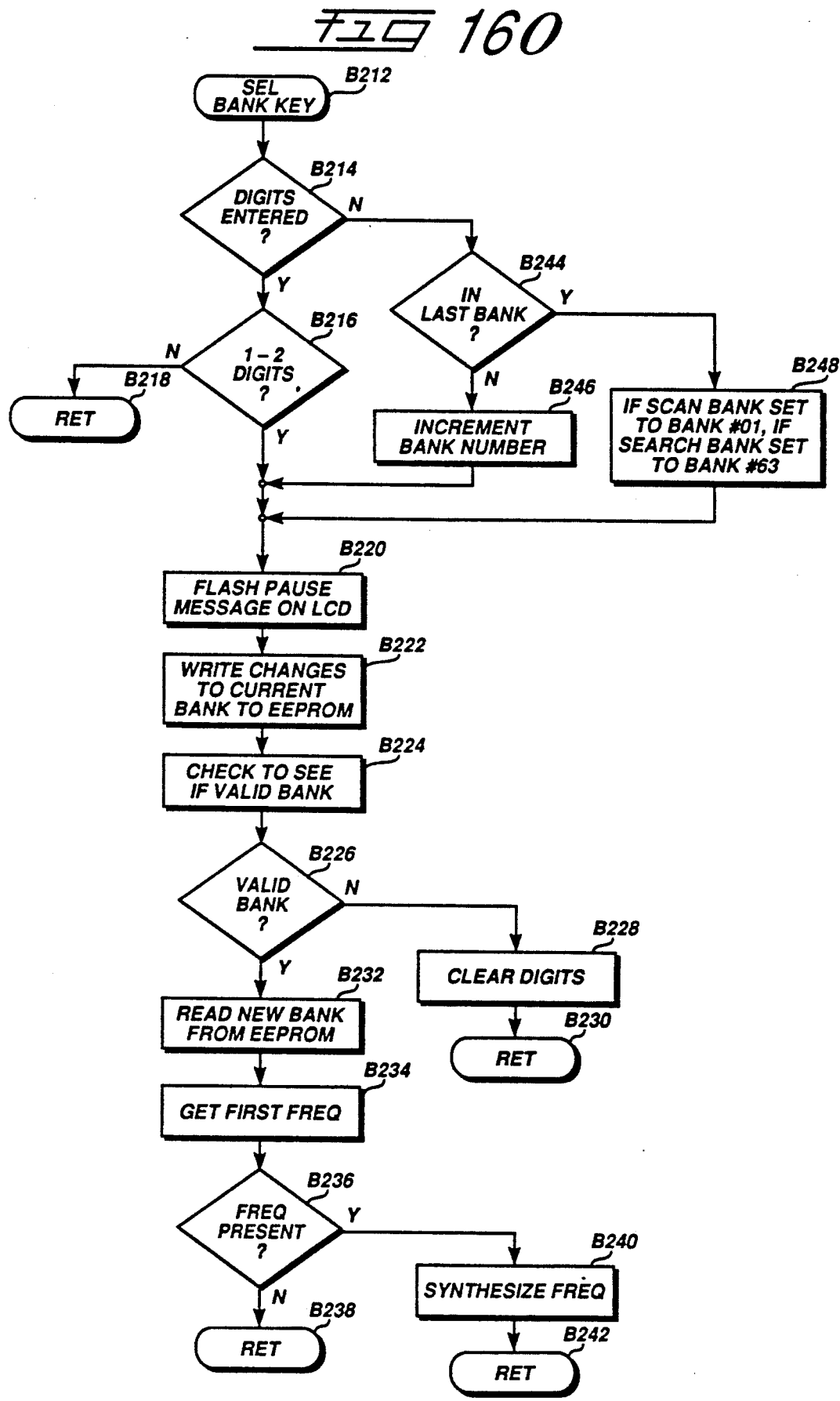
Figure 16V:
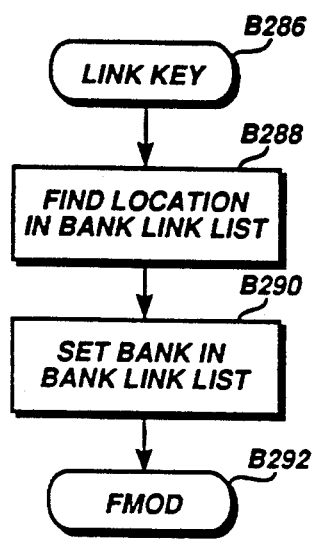
Figure 16X:
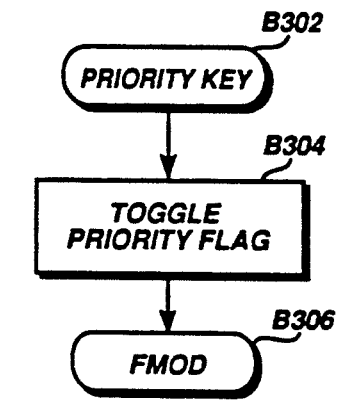
Figure 16W:
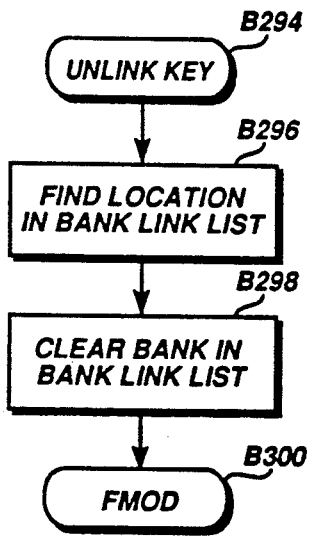
Figure 16Y:
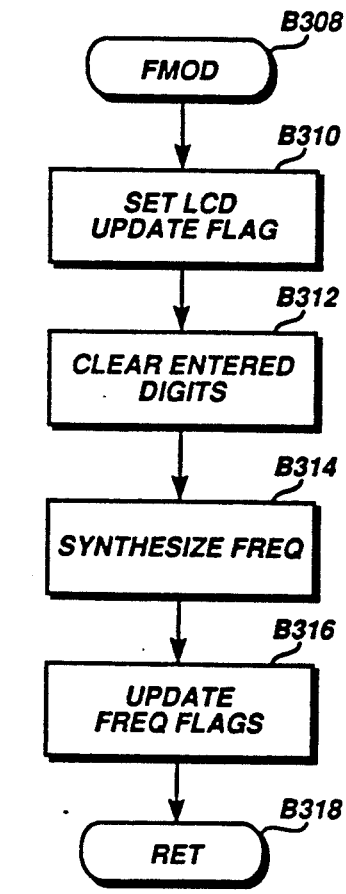
Figure 16Z:
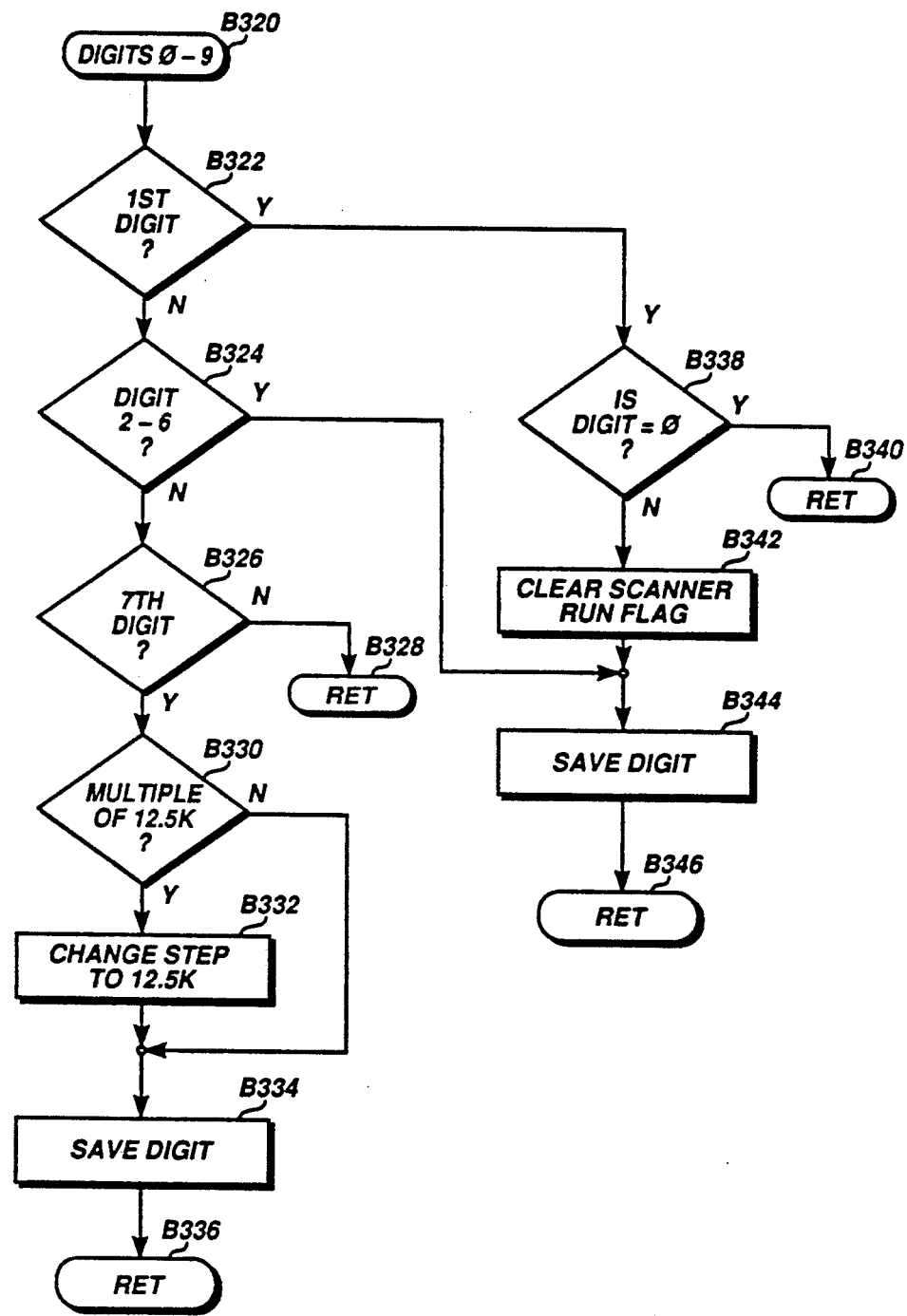

FIGS. 16A-16Z are a detailed flowchart of the keypad handler module which decodes the keypad commands and performs the indicated functions. The keypad handler module is executed as one of the substeps of processing the keyboard in block A18 of FIG. 9.

Figure 17:
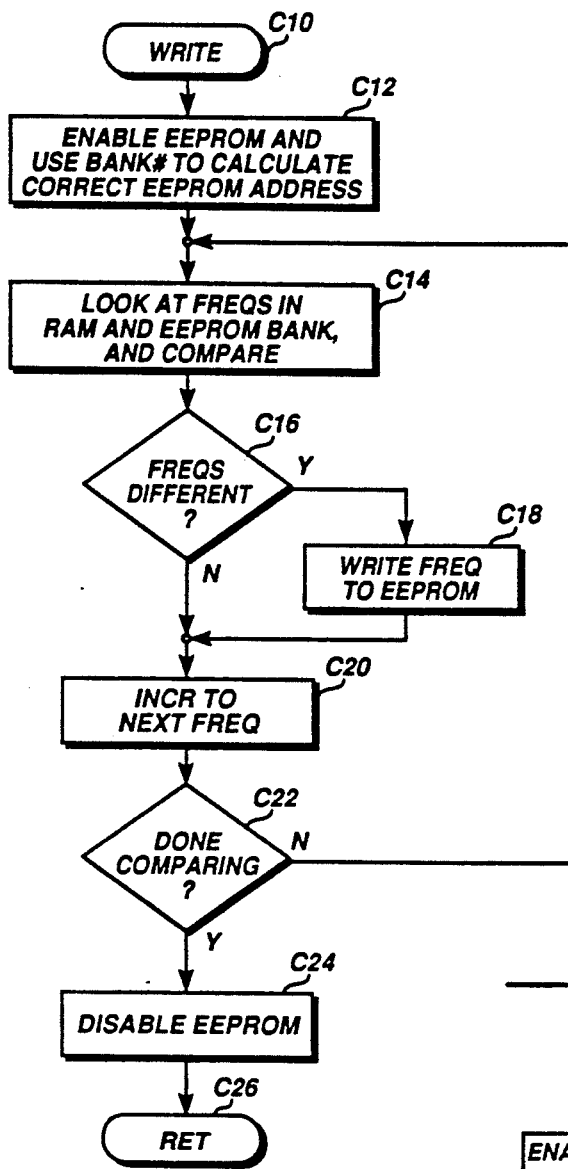
FIGS. 17 and 18 are a detailed flowchart of the programs used to write and read the EEPROM.
Figure 18:
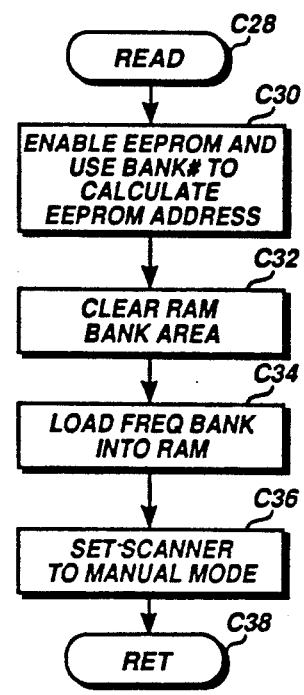
Figure 19A:
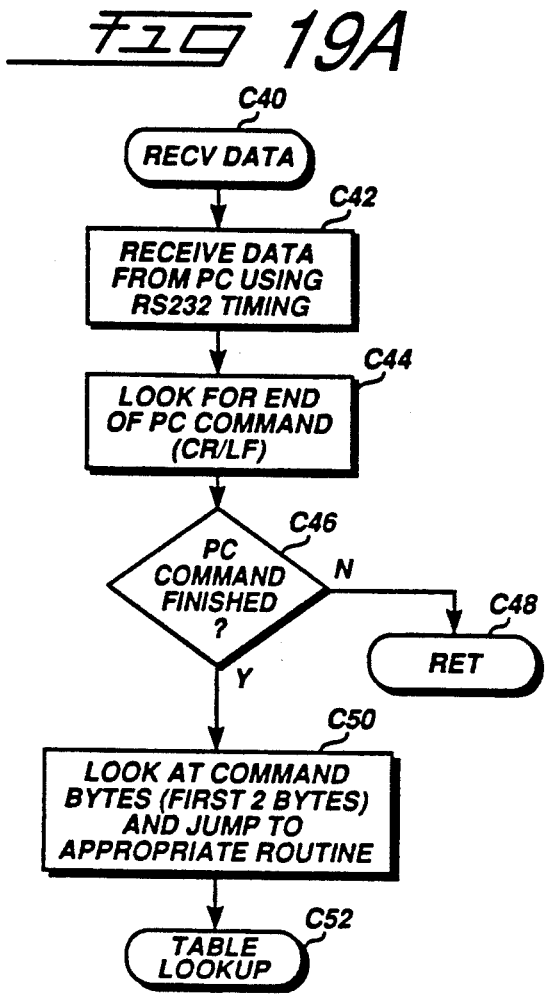
Figure 19B:
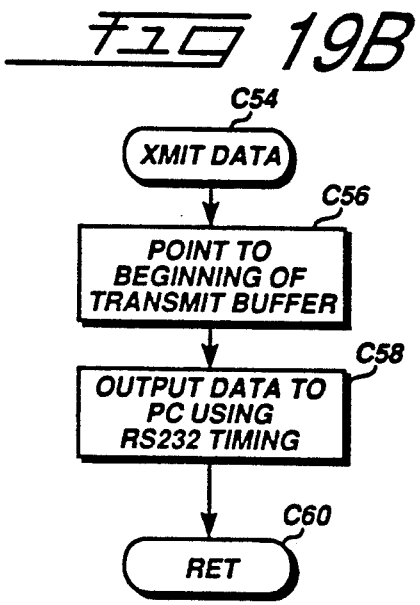

FIGS. 17 and 18 are the detailed flowcharts of routines used to write and read the EEPROM 302, respectively. The write routine is used for changes in a bank after the data has been sorted into descending order. The read routine is used to pull a bank out of storage, either for a scan mode or search mode or for uploading the bank.

FIGS. 19A-19M are a detailed flowchart of the communications module. The communications module is used to download commands to the application program and to write data to the remote processor 14. The module uses a look up table, similar to the keypad module, to process commands from the remote processor. Only those routines which are different are illustrated.

While the preferred embodiment of the invention has been shown and described in detail, it will be obvious to those skilled in the art that various modifications and changes may be made thereto without departing from the spirit and scope of the invention as is defined in the appended claims.

What is claimed is:

1. A scanning receiver for receiving information transmitted on selected radio frequencies over a substantially large bandwidth, said receiver adapted to accept said selected radio frequencies in any random order chosen by the user, said receiver comprising:

receiver circuitry including a local oscillator for providing a signal which is tunable to a frequency based on one of a plurality of frequency control words, a front end for amplifying and filtering radio frequency signals across the large bandwidth to provide input signals, and a mixer for providing an intermediate frequency signal based upon said input signals and the frequency of said local oscillator signal;

memory means for storing a data base of said frequency control words from which said selected frequencies are chosen, said frequency control words being stored in said memory means in a plurality of banks, each bank having a predetermined number of frequency control words; and receiver control means for providing said frequency control words to said receiver circuitry, said receiver control means including;

a random access memory;

means for reading into said random access memory of said receiver control means a bank of frequency control words from said memory means;

means for storing said bank of frequency control words as a function of frequency; and means for controlling the scanning of said sorted bank of frequency control words by sequentially transferring frequency control words from said random access memory to said receiver circuitry.

2. The receiver as set forth in claim 1 wherein said memory means comprises nonvolatile memory.

3. The receiver as set forth in claim 2 wherein said nonvolatile memory includes EEPROM.

4. The receiver as set forth in claim 3 wherein said receiver control means further includes:

means for changing said frequency control words in said sorted bank while in said random access memory.

5. The receiver as set forth in claim 4 wherein said scanning control means is adapted to scan a current bank followed by a next bank, wherein said current bank is overwritten in said random access memory by said next bank if there have been no changes in the current bank, and wherein said current bank is written to said memory means if there have been changes in the current bank.

6. The receiver as set forth in claim 5 wherein said next bank is selected based upon whether it is linked to said current bank.

7. The receiver as set forth in claim 2 wherein said receiver control means further includes:

means for adding a frequency control word to the current bank in random access memory.

8. The receiver as set forth in claim 2 wherein said receiver control means further includes:

means for deleting a frequency control word from the current bank in random access memory.

9. The receiver as set forth in claim 1, wherein said receiver control means further includes means for inputting a plurality of selected radio frequencies into said memory means in the order chosen by the user.

10. The receiver as set forth in claim 1, wherein said receiver control means includes for communicating frequency control words from said receiver control means to a remote processor.

11. The receiver as set forth in claim 10, wherein said communicating means includes circuit means for coupling a serial link from said scanning receiver directly to said remote processor.

12. A system for scanning a number of radio frequency channels, said system comprising:

scanning receiver means for receiving signals on various radio frequency channels, said scanning receive means enclosed in a single housing, said scanning receiver means including:

synthesizer means for generating a local oscillator signal in response to digital frequency codes;

memory means for storing a data base of said digital frequency codes;

microprocessor means for controlling said synthesizer means, for reading digital frequency codes stored in said memory means, and for providing digital frequency codes to said synthesizer means; and circuit means for providing two-way communications of said data base of digital frequency codes over a serial link between said microprocessor means and a remote processor without requiring any communications adapter circuitry external to said housing;

said system further comprising:

remote processor means for communicating with said scanning receiver means, said remote processor means enclosed in a single enclosure, said remote processor means including:

memory means for storing a remote data base of digital frequency codes which substantially duplicates said scanning receiver data base;

interface means for permitting a user to edit said remote data base; and controller means for providing two-way communications of said remote data base of digital frequency codes over a serial link with said scanning receiver means without requiring any communications adapter circuitry external to said enclosure;

said system further comprising:

a direct serial communications link between said scanning receiver means housing and said remote processor means enclosure.

13. The system as set forth in claim 12 wherein said scanning receiver means further includes:

random access memory means for storing a limited portion of said data base of said digital frequency codes.

14. The system as set forth in claim 13 wherein said microprocessor means includes:

means for sorting said limited portion of said data base stored in said random access memory as a function of frequency before providing digital frequency codes to said synthesizer means.

15. The system as set forth in claim 12 wherein said receiver memory means includes EEPROM, and wherein said scanning receiver data base is stored in said EEPROM.

16. The system as set forth in claim 15 wherein said scanning receiver means further includes:

interface means for permitting a user to edit said scanning receiver data base.

17. The system as set forth in claim 16 wherein said microprocessor means further includes;

means for writing digital frequency codes into said EEPROM only if said scanning receiver data base has been edited.

18. The system as set forth in claim 12 wherein said controller means includes:

means for uploading frequency code data to said remote processor means from said scanning receiver means.

19. The system as set forth in claim 12 wherein said controller means further includes:

means for downloading frequency code data to said scanning receiver means from said remote processor means.

20. The system as set forth in claim 12 wherein said remote processor interface means includes a keyboard and display monitor.

21. A scanning receiver for receiving information transmitted on selected radio frequencies over a substantially large bandwidth, said receiver adapted to accept said selected radio frequencies in any random order chosen by the user, said receiver comprising:

receiver circuitry including a local oscillator for providing a signal which is tunable to a frequency based on one of a plurality of frequency control words, a front end for amplifying and filtering radio frequency signals across the large bandwidth to provide input signals, and a mixer for providing an intermediate frequency signal based upon said input signals and the frequency of said local oscillator signal;

memory means for storing a data base of said frequency control words from which said selected frequencies are chosen, said frequency control words being stored in said memory means in a plurality of banks, each bank having a predetermined number of frequency control words, said memory means comprising nonvolatile memory including EEPROM; and receiver control means for providing said frequency control words to said receiver circuitry, said receiver control means including a microprocessor having:

a random access memory;

means for reading into said random access memory a bank of frequency control words from said memory means;

means for sorting said bank of frequency control words as a function of frequency;

means for controlling the scanning of said sorted bank of frequency control words by sequentially transferring frequency control words from said random access memory to said receiver circuitry, wherein said microprocessor is programmed to scan a current bank followed by a next bank, wherein said current bank is overwritten in said random access memory by said next bank if there have been no changes in the current bank, and wherein said current bank is written to said memory means if there have been changes in the current bank.

22. The receiver as set forth in claim 21 wherein said next bank is selected based upon whether it is linked to said current bank.

23. The receiver as set forth in claim 21 wherein said microprocessor further includes:

means for adding a frequency control word to the current bank in random access memory.

24. The receiver as set forth in claim 21 wherein said microprocessor further includes:

means for deleting a frequency control word from the current bank in random access memory.

25. A scanning receiver for receiving information transmitted on selected radio frequencies over a substantially large bandwidth, said receiver comprising:

receiver circuitry including a local oscillator for providing a signal which is tunable to a frequency based on one of a plurality of frequency control words, a front end for amplifying and filtering radio frequency signals across the large bandwidth to provide input signals, and a mixer for providing an intermediate frequency signal based upon said input signals and the frequency of said local oscillator signal;

EEPROM memory means for storing a data base of said frequency control words from which said selected frequencies are chosen, said frequency control words being stored in said EEPROM memory means in a plurality of banks, each bank having a predetermined number of frequency control words; and microprocessor control means for providing said frequency control words to said receiver circuitry, said microprocessor control means including:

a random access memory;

means for reading into said random access memory a bank of frequency control words from said EEPROM memory means;

means for changing a parameter of at least one of said frequency control words in said bank while in said random access memory, thereby providing a bank of modified frequency control words;

means for controlling the scanning of said bank of modified frequency control words by sequentially transferring modified frequency control words from said random access memory to said receiver circuitry; and means for writing into said EEPROM memory means said bank of modified frequency control words from said random access memory.

26. The receiver as set forth in claim 25 wherein said parameter which is changed to provide said bank of modified frequency control words is the order said frequency control words are arranged in said bank.

27. A method of controlling a scanning receiver which receives information transmitted on preselected radio frequencies, said method comprising the steps of:

inputting into a radio controller a plurality of preselected radio frequencies in any random order chosen by the user;

converting said plurality of preselected radio frequencies into a plurality of frequency control words;

storing said plurality of frequency control words in a nonvolatile memory in the order chosen by the user;

reading said plurality of frequency control words from said nonvolatile memory into a random access memory;

sorting said plurality of frequency control words as a function of frequency;

providing one of said sorted frequency control words to a frequency synthesizer;

providing a local oscillator signal which has a frequency based upon said one sorted frequency control word;

amplifying and filtering radio frequency signals to provide input signals;

providing an intermediate frequency signal based upon said input signals and said local oscillator signal;

converting and amplifying said intermediate frequency signal to provide an audio frequency signal to the user; and controlling the scanning of said preselected radio frequencies by sequentially providing frequency control words to said frequency synthesizer in the sorted frequency order.

28. The method as set forth in claim 27, further comprising the steps of:

determining whether said plurality of frequency control words stored in said nonvolatile memory are in the sorted frequency order; and storing said plurality of frequency control words in said nonvolatile memory in the sorted frequency order only if not already stored in such order.

29. The method as set forth in claim 28, further comprising the step of:

communicating a plurality of frequency control words between said scanning receiver and a remote processor; and storing a remote data base of frequency control words in said remote processor which substantially duplicates said plurality of frequency control words stored in said nonvolatile memory.

* * * * *

UNITED STATES PATENT AND TRADEMARK OFFICE
CERTIFICATE OF CORRECTION

PATENT NO. : 5,163,161

DATED : November 10, 1992

INVENTOR(S) : Byron D. Bowles and Lowell G. Atkinson

It is certified that error appears in the above-identified patent and that said Letters Patent is hereby corrected as shown below:

Column 1, line 7, after "scanning" delete "r" and insert therefor --receivers

Column 2, line 35, after "tor" delete "s" and insert therefor --is--;

Column 3, line 59, after "is" delete the comma;

Column 4, line 18, delete "SIGI" and insert therefor --SIG1--;

Column 4, line 24, delete "16E" and insert therefor --16Z--;

Column 4, line 25, delete "line" and insert therefor --routine--

Column 5, line 33, delete the exclamation mark and insert therefor --1--;

Column 6, line 12, delete "13" and insert therefor --132--;

Column 6, line 16, delete "When" and insert therefor --when--;

Column 7, line 26, delete "looked" and insert therefor --locked--;

UNITED STATES PATENT AND TRADEMARK OFFICE
CERTIFICATE OF CORRECTION

PATENT NO. : 5,163,161
DATED : November 10, 1992
INVENTOR(S) : Byron D. Bowles and Lowell G. Atkinson It is certified that error appears in the above-identified patent and that said Letters Patent is hereby corrected as shown below:

Column 11, line 32, after "into" insert --a--;

Column 11, line 38, delete "32" and insert therefor --232--;

Column 11, line 43, after "52" insert a period;

Column 14, line 37, delete "V" and insert therefor --+V--;

Column 14, line 38, delete "s" and insert therefor --is--;

Column 14, line 47, after "348" insert a period;

Column 14, line 65, delete "COMO" and insert therefor --COM0--;

Column 15, line 1, delete "CMO" and insert therefor --Cm0--;

Column 15, line 58, delete "T11, T12" and insert therefor --TI1, TI2--;

Column 16, line 37, delete "104" and insert therefor --14--;

Column 16, line 60, delete "2 K" and insert therefor --2K--;

Column 17, line 47, delete "SIGI" and insert therefor --SIG1--;

Column 17, line 54, delete "SIGI" and insert therefor --SIG1--;

UNITED STATES PATENT AND TRADEMARK OFFICE
CERTIFICATE OF CORRECTION

PATENT NO. : 5,163,161

DATED      : November 10, 1992

INVENTOR(S) : Byron D. Bowles and Lowell G. Atkinson

It is certified that error appears in the above-identified patent and that said Letters Patent is hereby corrected as shown below:

Column 19, line 45, delete "LOCKO" and insert therefor --LOCK0--;

Column 20, line 42, delete "se" and insert therefor --set--;

Column 20, line 64, after "then" delete the hyphen;

Column 21, line  5, delete "SIGI" and insert therefor --SIG1--;

Signed and Sealed this

First Day of February, 1994

BRUCE LEHMAN

*Attest:*

*Attesting Officer*     *Commissioner of Patents and Trademarks*